US006853023B2

United States Patent
Goebel et al.

(10) Patent No.: US 6,853,023 B2
(45) Date of Patent: Feb. 8, 2005

(54) SEMICONDUCTOR MEMORY CELL CONFIGURATION AND A METHOD FOR PRODUCING THE CONFIGURATION

(75) Inventors: Bernd Goebel, Dresden (DE); Jörn Lützen, Dresden (DE); Martin Popp, Dresden (DE); Harald Seidl, Feldkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/356,780

(22) Filed: Jan. 31, 2003

(65) Prior Publication Data

US 2003/0169629 A1 Sep. 11, 2003

Related U.S. Application Data

(63) Continuation-in-part of application No. PCT/DE01/02798, filed on Jul. 23, 2001.

(30) Foreign Application Priority Data

Jul. 31, 2000 (DE) .......................................... 100 38 728

(51) Int. Cl.$^7$ ............................................. H01L 27/108
(52) U.S. Cl. ...................... 257/301; 257/302; 257/774; 438/242; 438/243; 438/386
(58) Field of Search ................. 257/301, 302, 257/774; 438/242, 243, 386, 471, 700, 257, 637–642

(56) References Cited

U.S. PATENT DOCUMENTS

| 4,672,410 A | * | 6/1987 | Miura et al. ................. 257/302 |
| 4,937,641 A | * | 6/1990 | Sunami et al. .............. 257/302 |
| 4,967,247 A | | 10/1990 | Kaga et al. |
| 5,519,236 A | * | 5/1996 | Ozaki .......................... 257/302 |
| 5,989,972 A | | 11/1999 | Widmann et al. |
| 6,373,099 B1 | * | 4/2002 | Kikuchi et al. ............. 257/331 |
| 2002/0017671 A1 | | 2/2002 | Goebel et al. |

FOREIGN PATENT DOCUMENTS

| DE | 198 45 004 A1 | 4/2000 |
| DE | 198 45 058 A1 | 4/2000 |
| DE | 199 23 262 C1 | 6/2000 |
| JP | 62140456 | 6/1987 |
| JP | 63240061 | 10/1988 |
| JP | 05291528 | 11/1993 |
| WO | 00/33383 | 6/2000 |
| WO | 01/17015 A1 | 3/2001 |

* cited by examiner

*Primary Examiner*—David Nelms
*Assistant Examiner*—Long Tran
(74) *Attorney, Agent, or Firm*—Laurence A. Greenberg; Werner H. Stemer; Gregory L. Mayback

(57) ABSTRACT

A semiconductor memory cell configuration includes dynamic memory cells respectively having a trench capacitor and a vertical selection transistor, the memory cells being disposed in matrix form, the trench capacitors and the associated vertical selection transistors following one another in each case in the form of rows and/or columns.

8 Claims, 35 Drawing Sheets

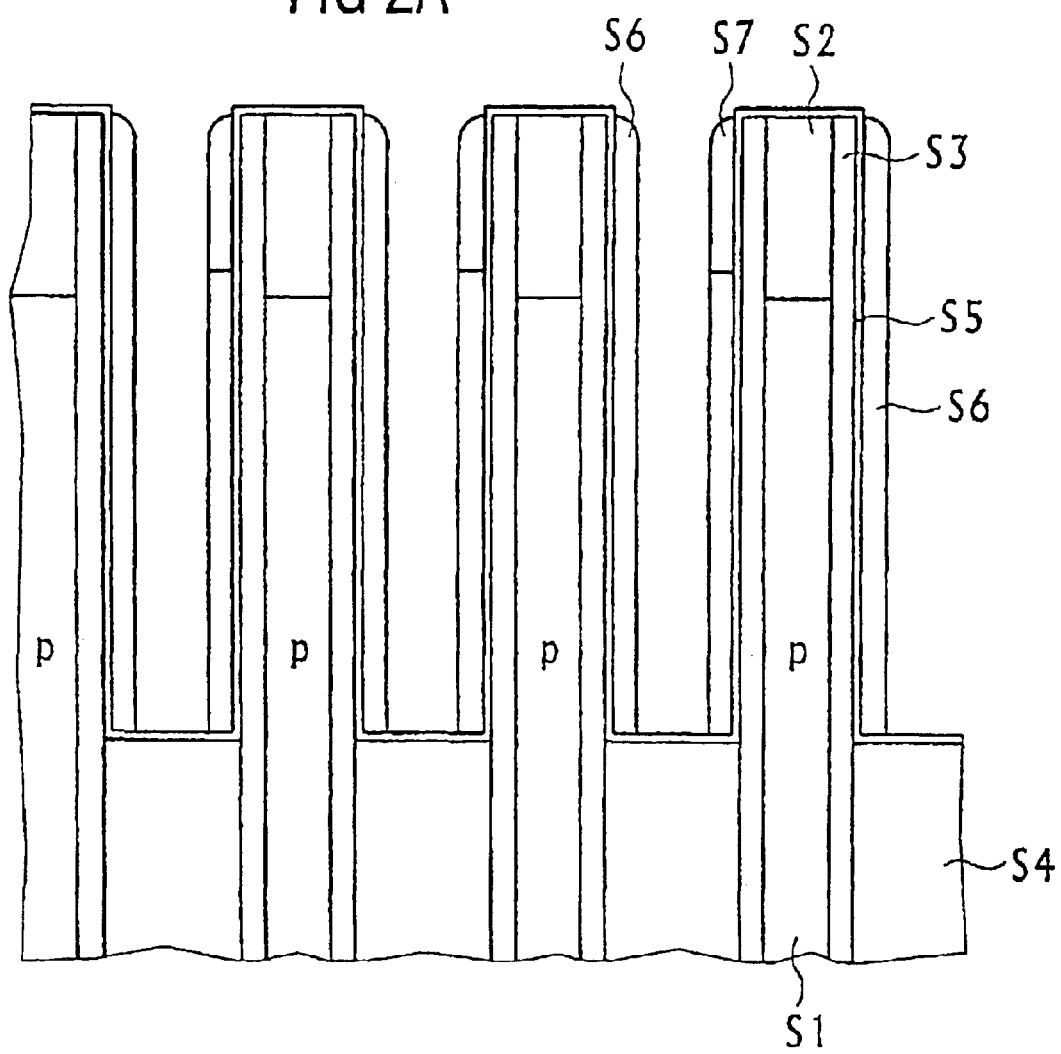

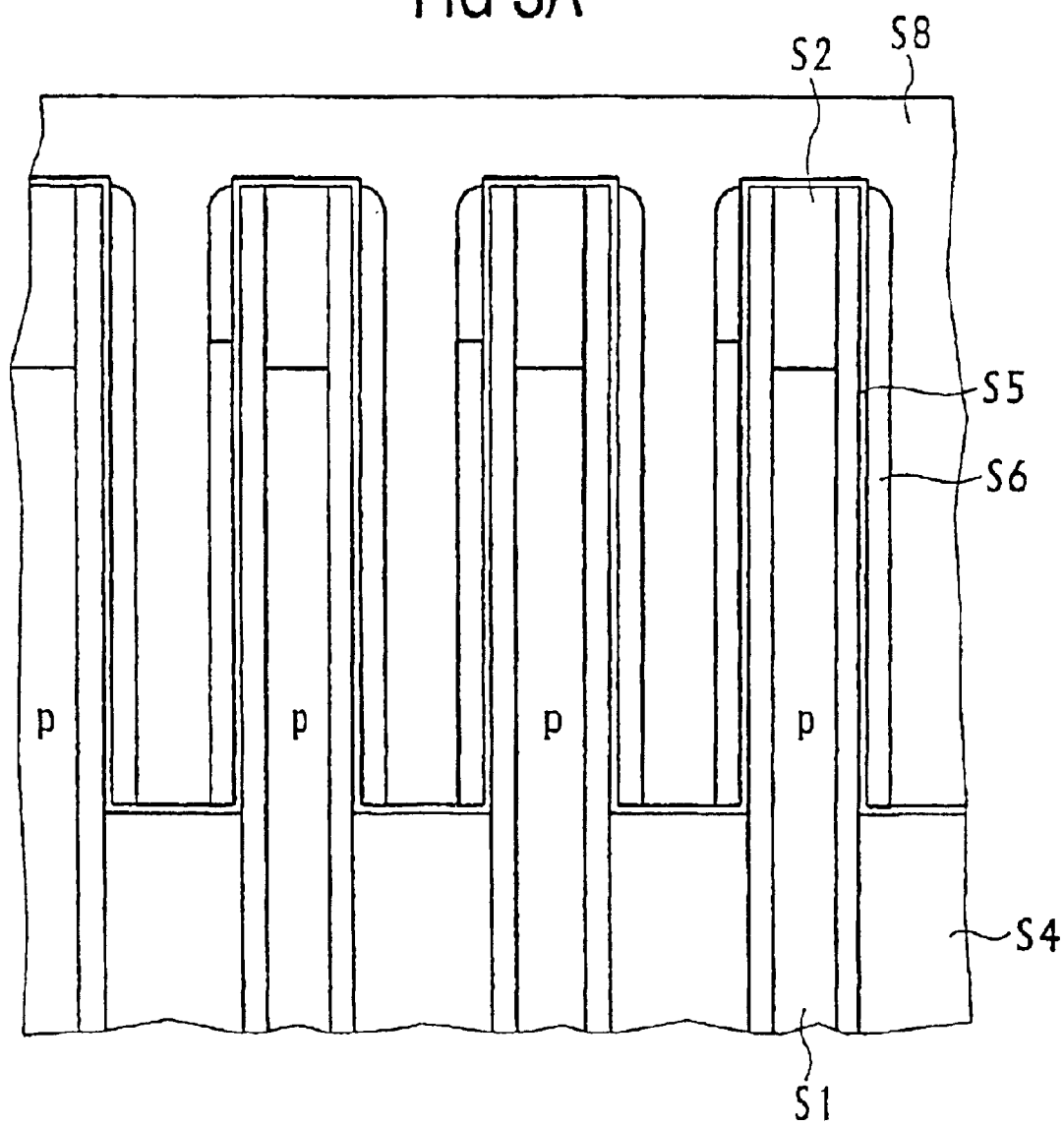

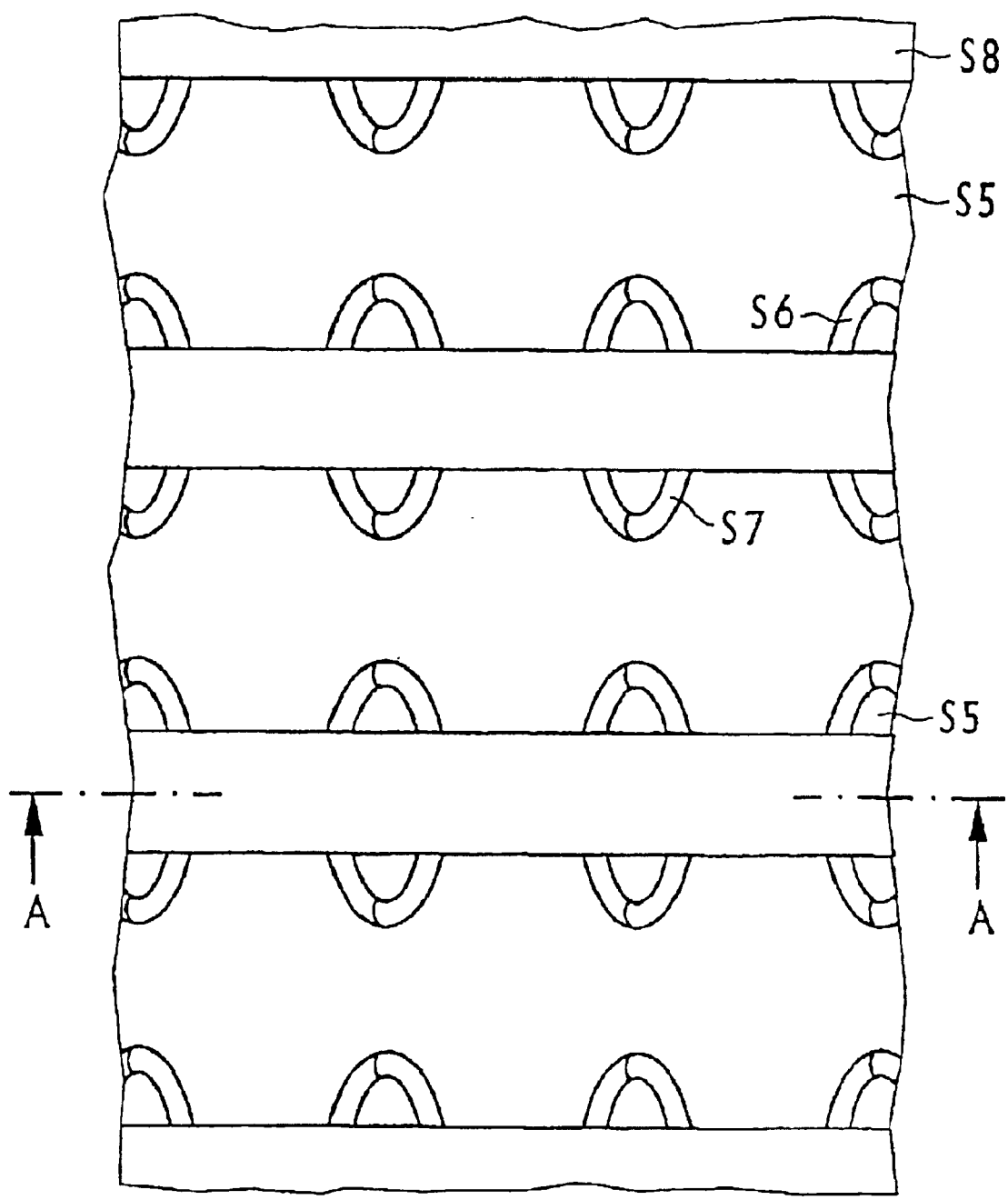

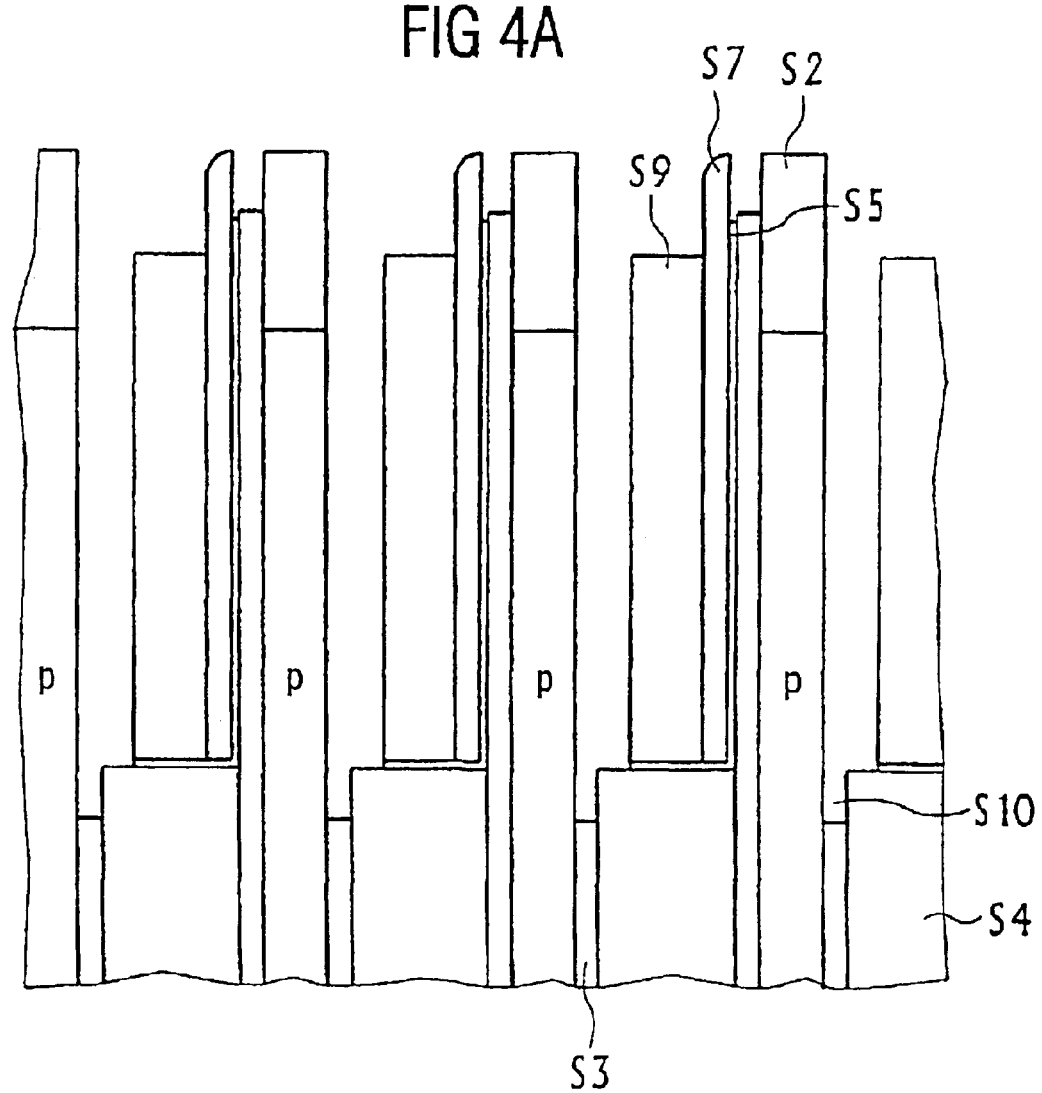

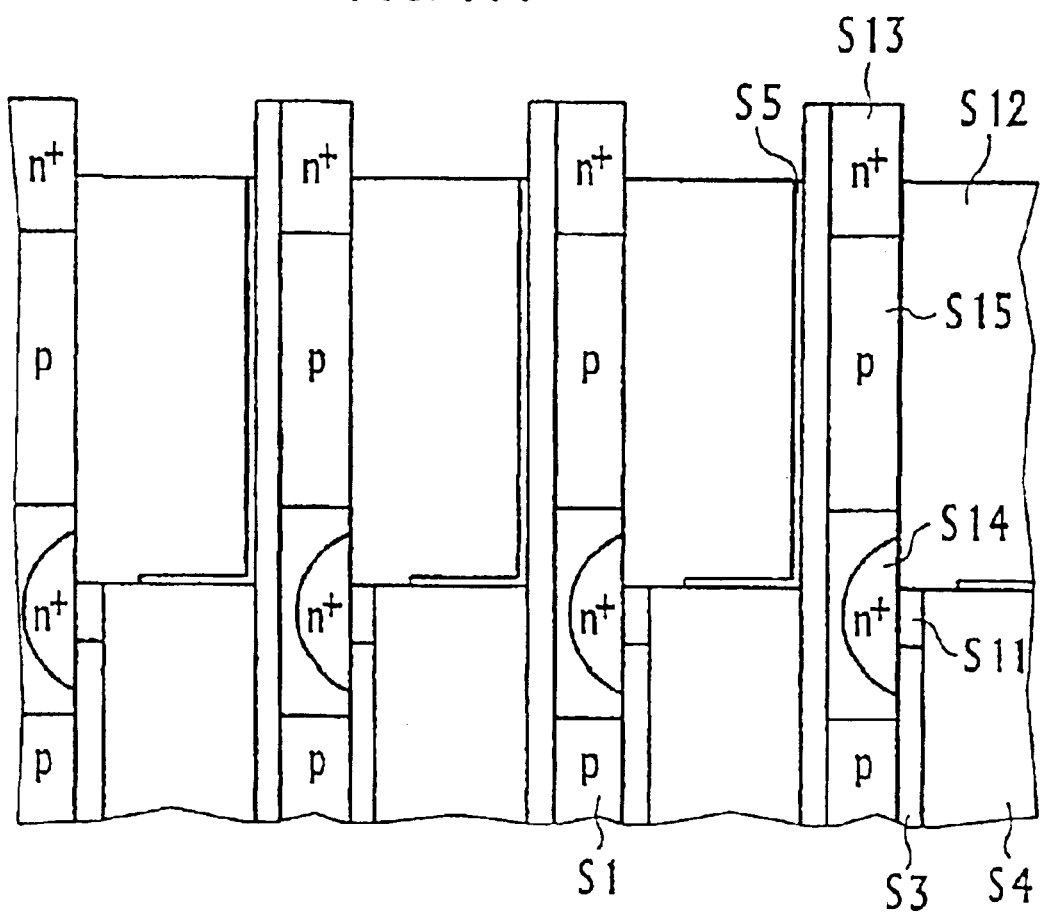

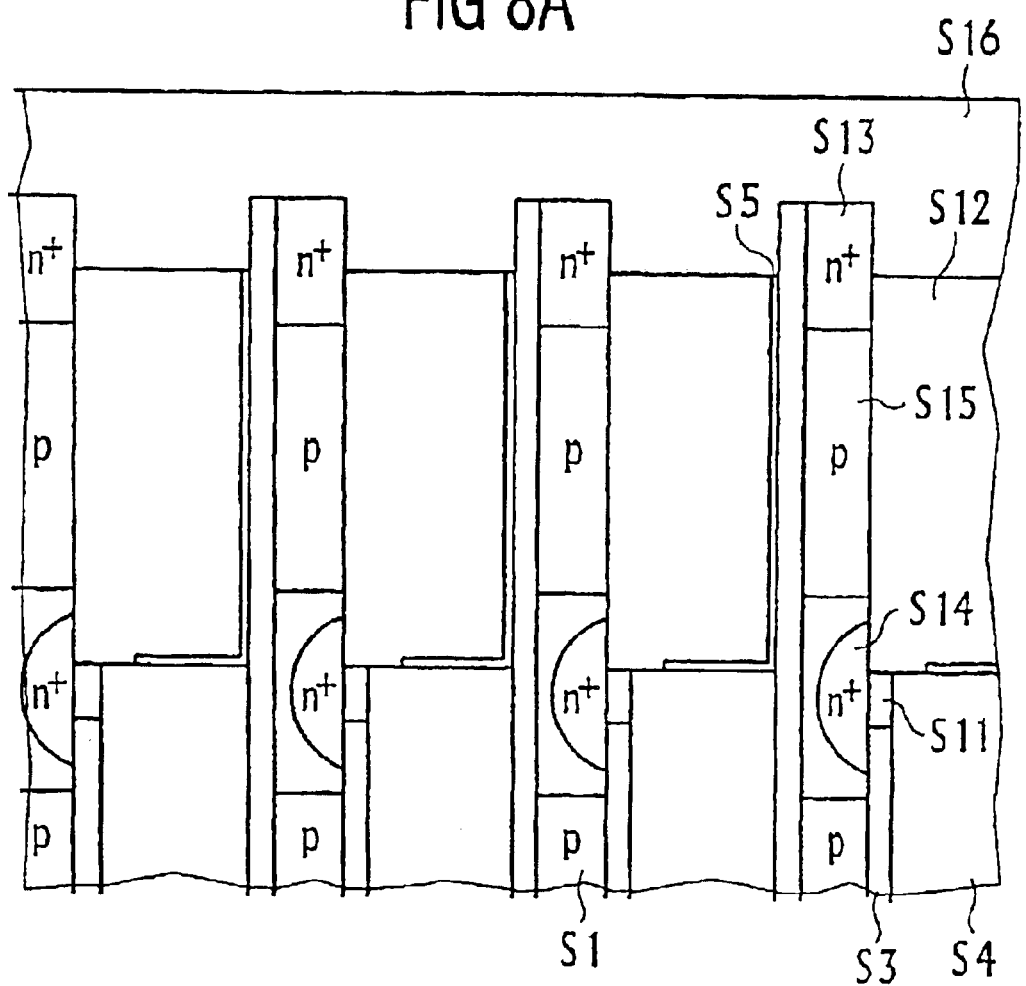

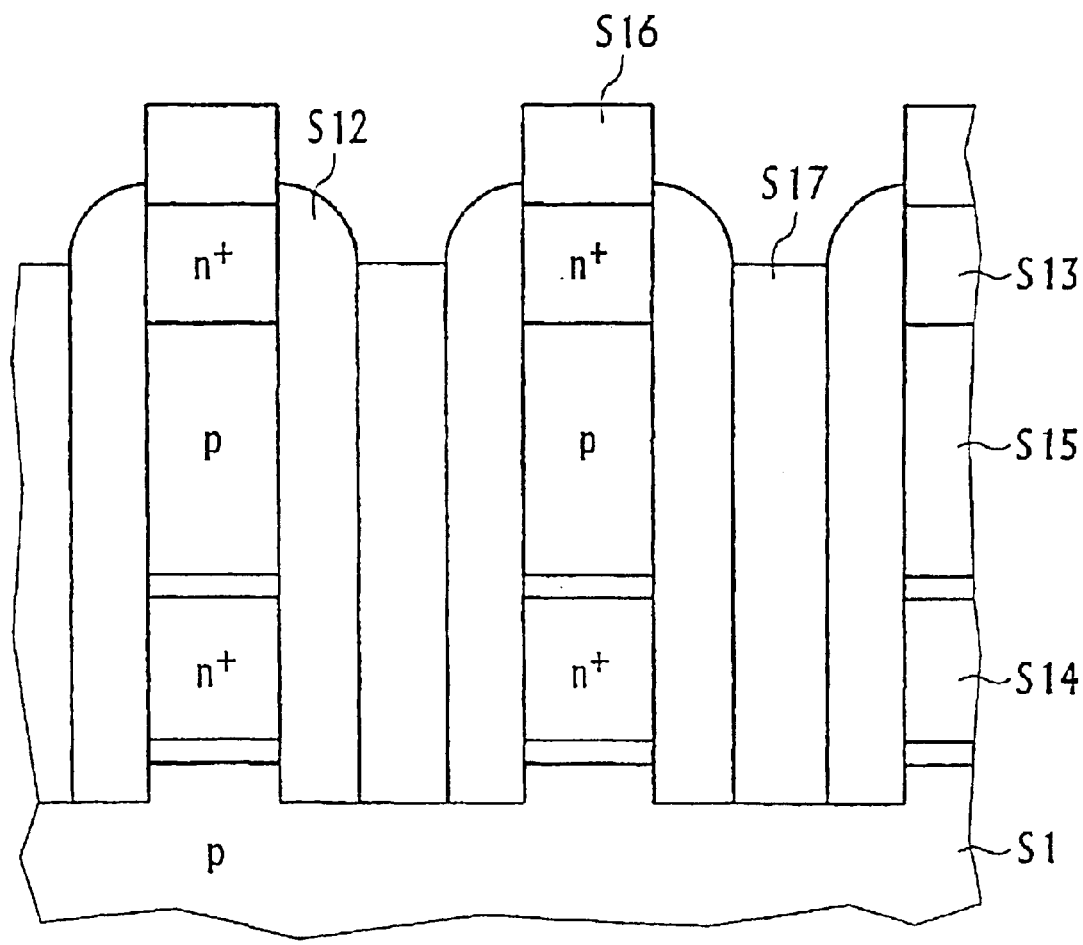

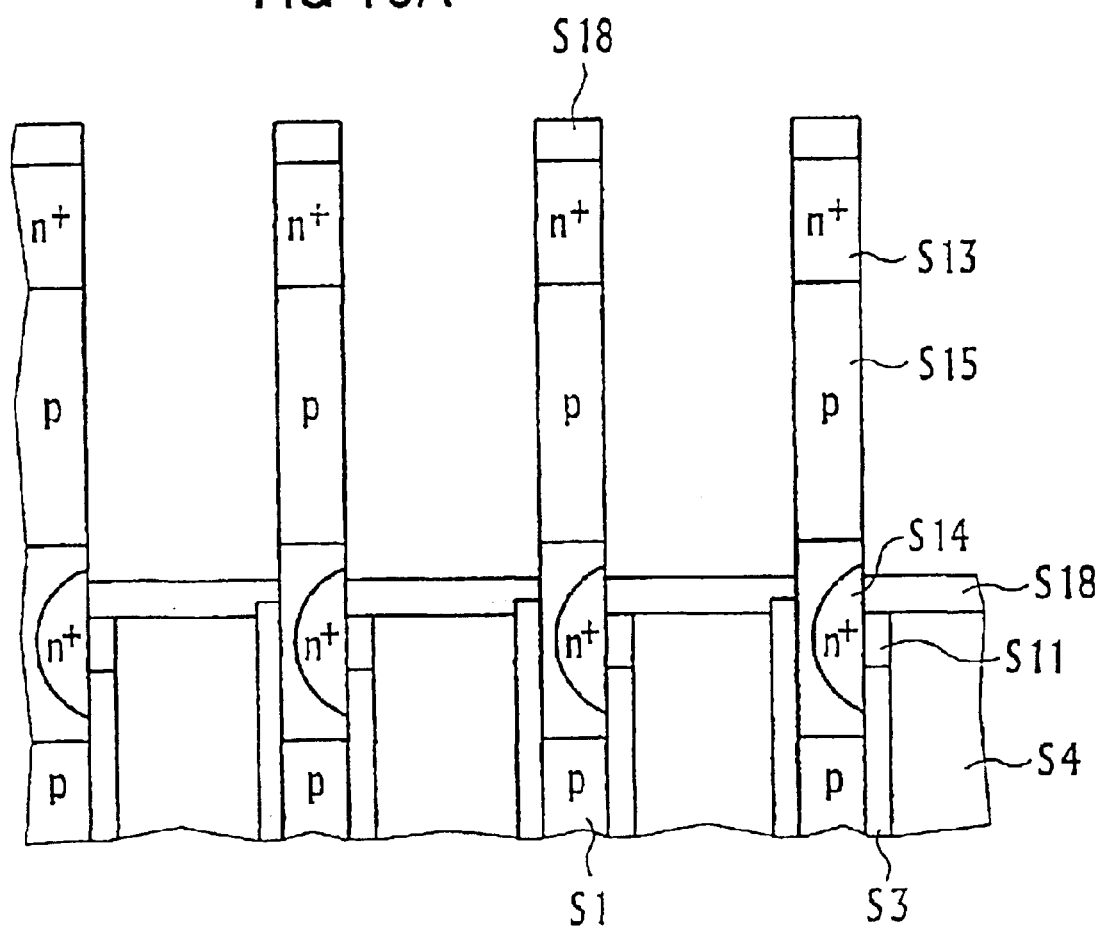

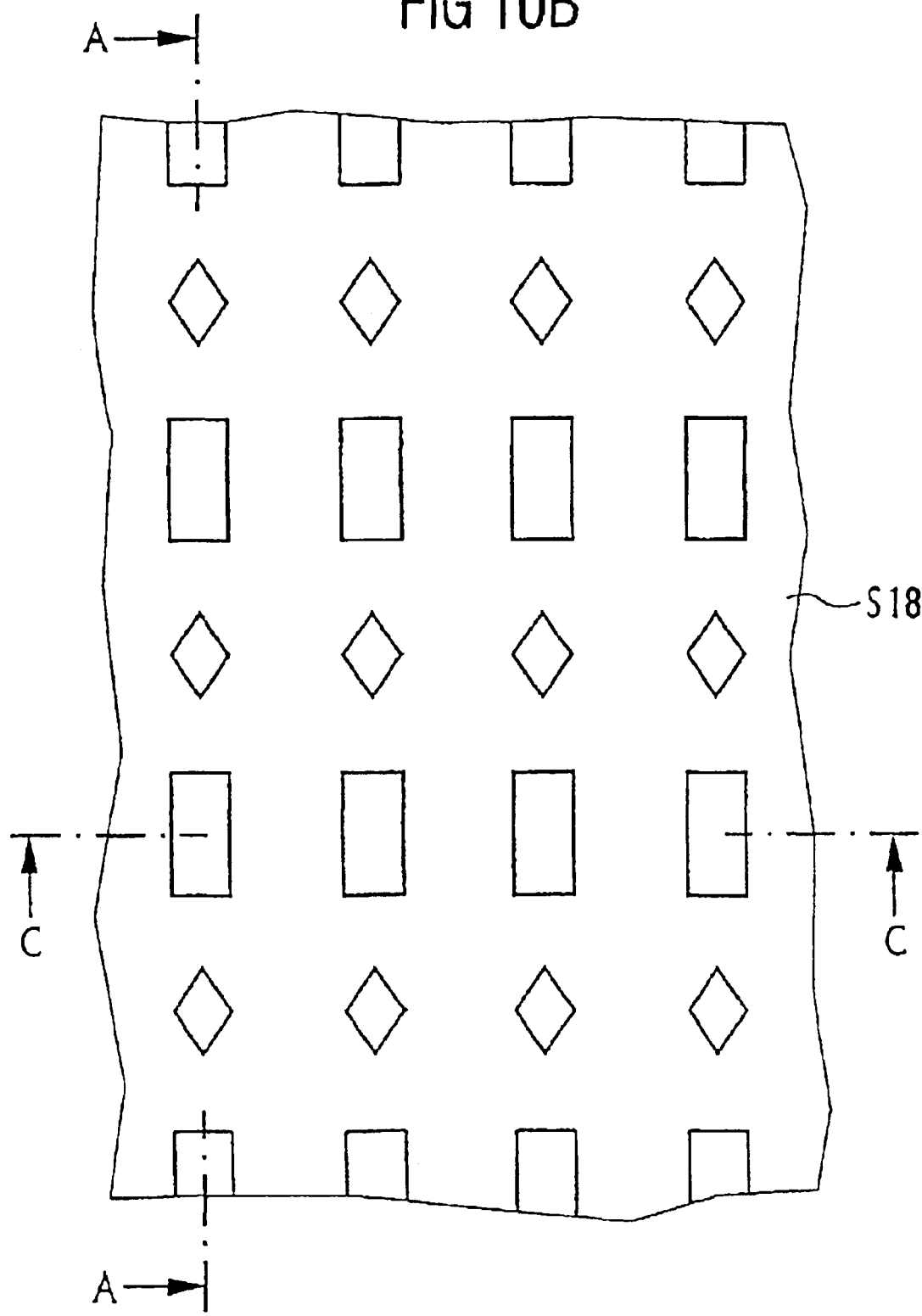

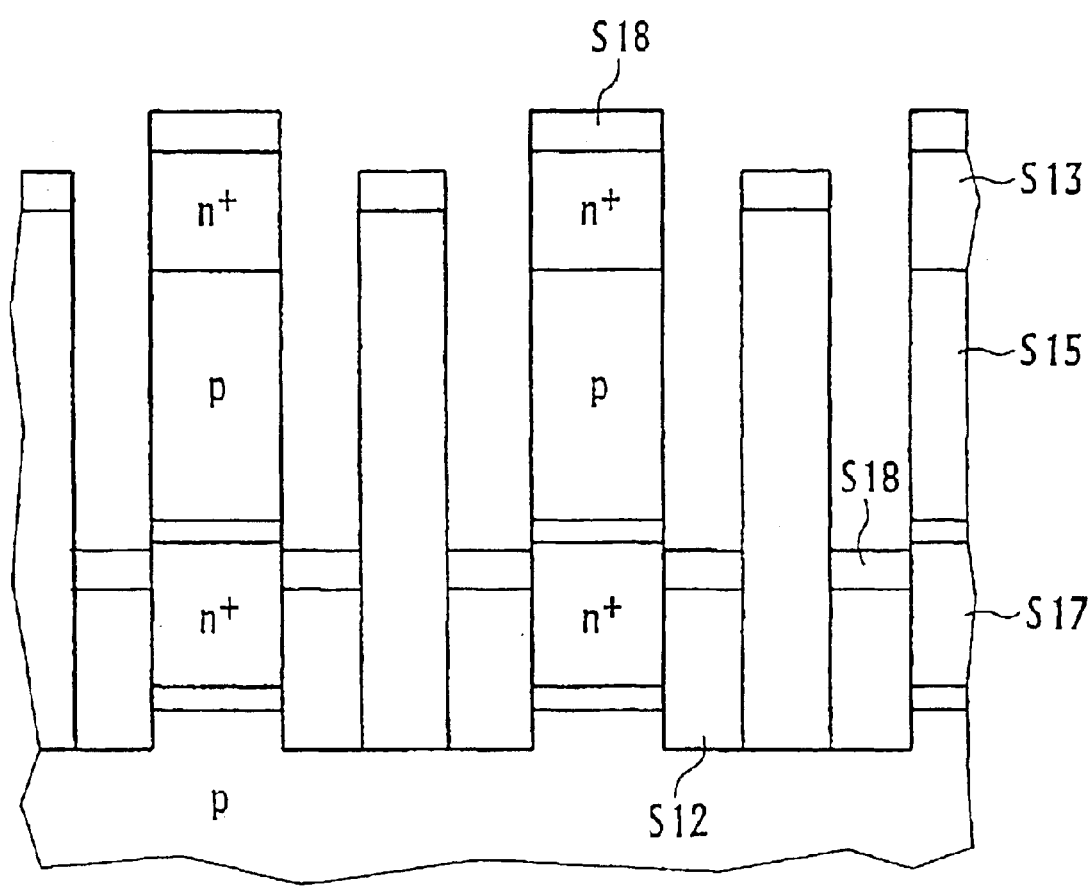

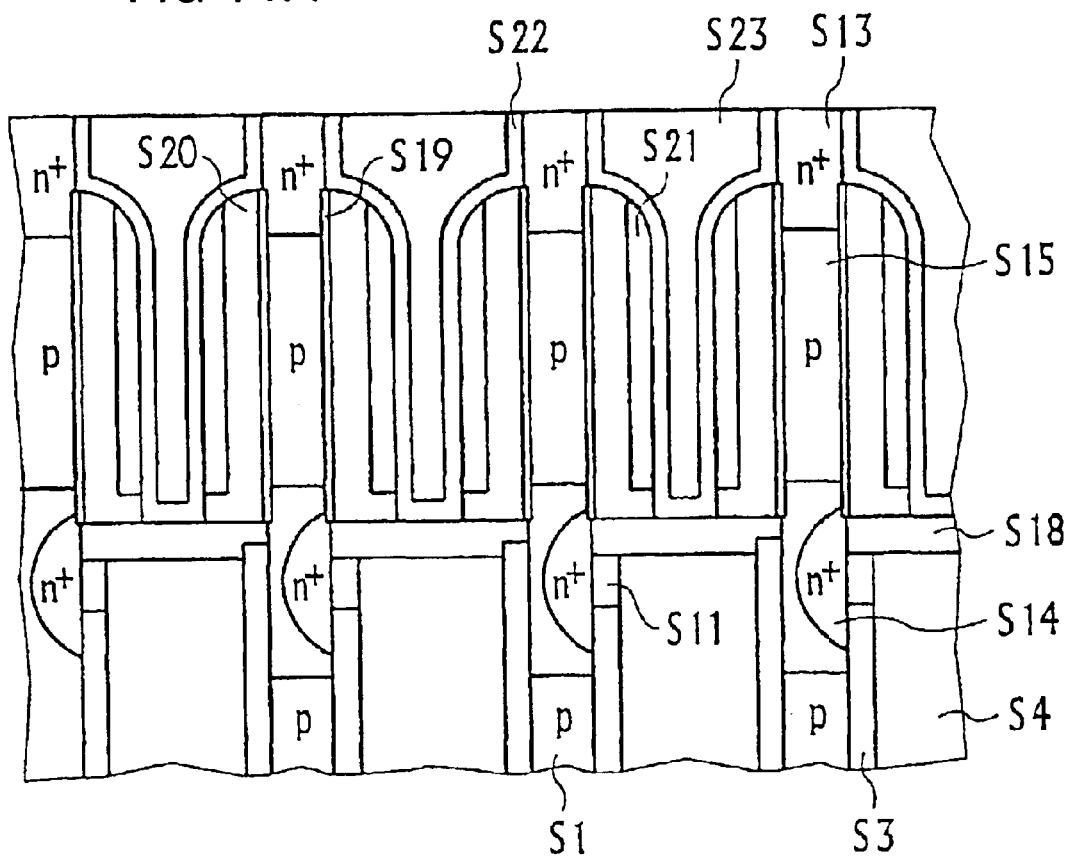

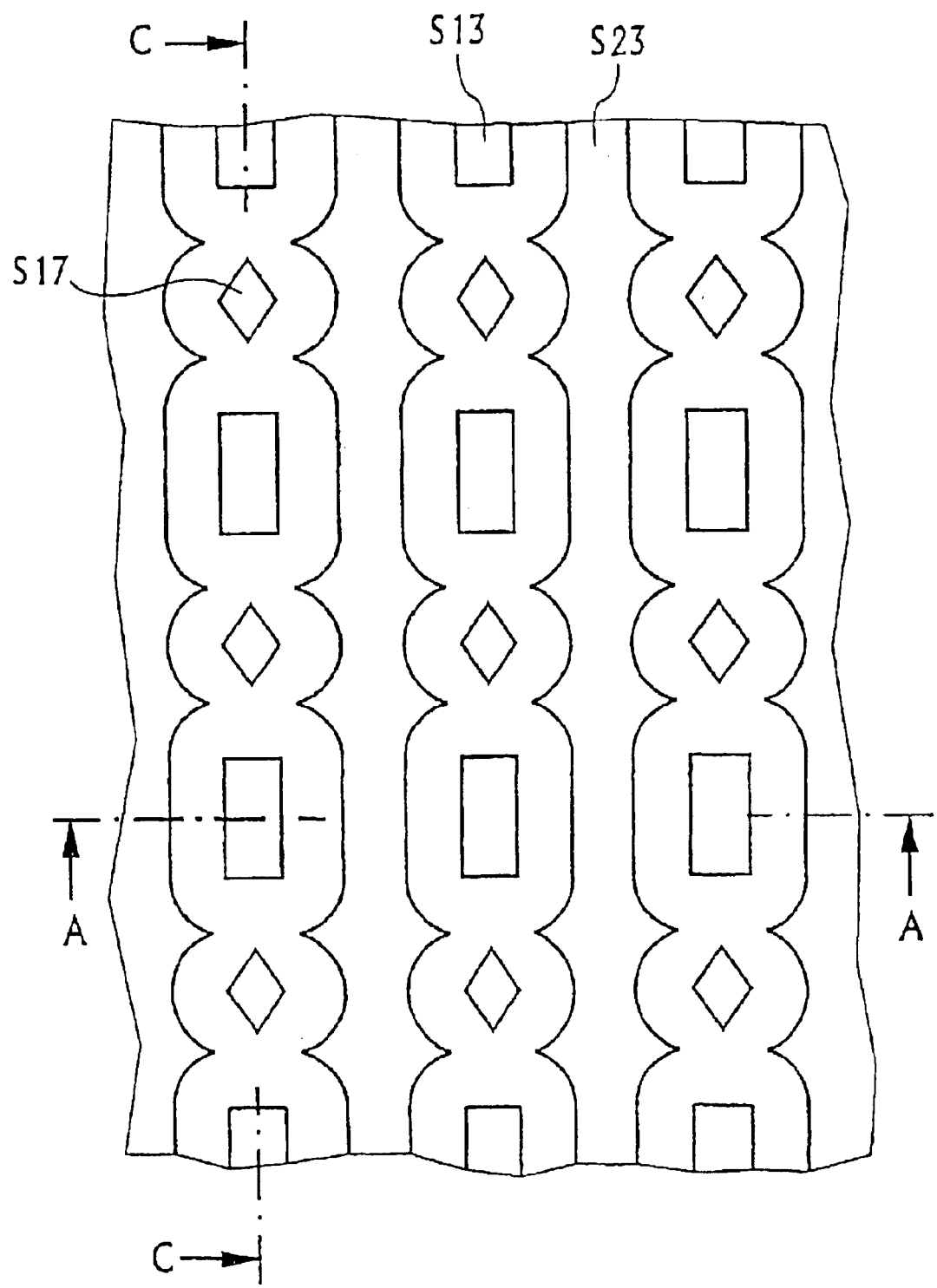

FIG 15
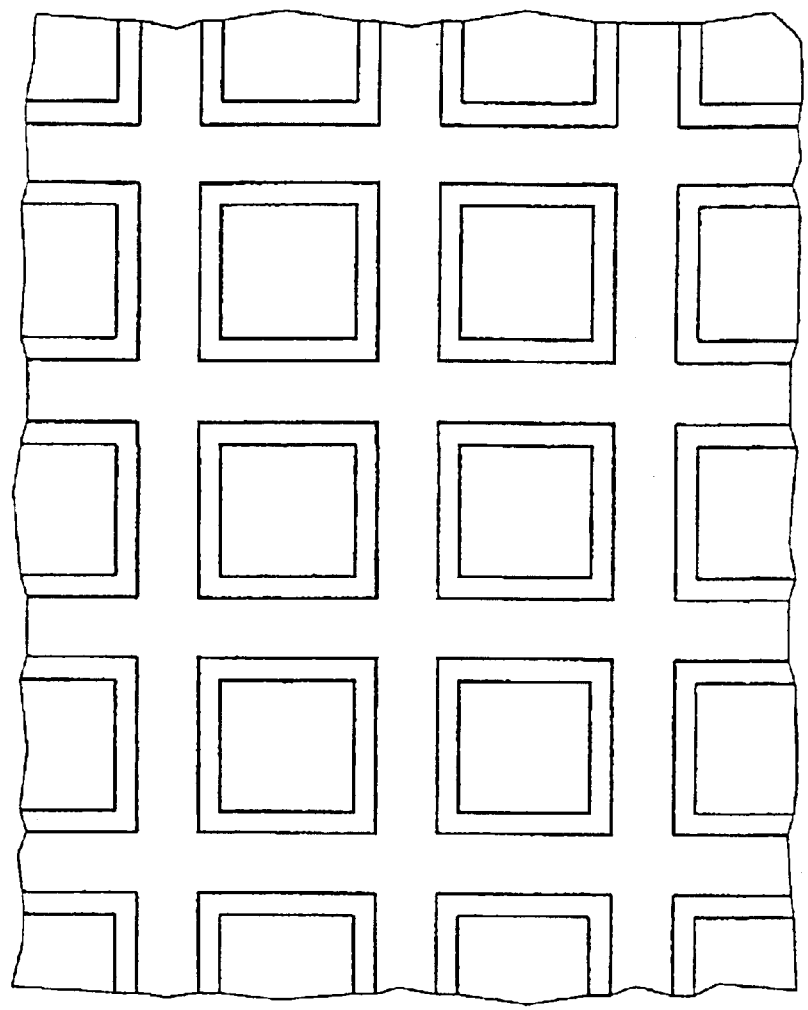
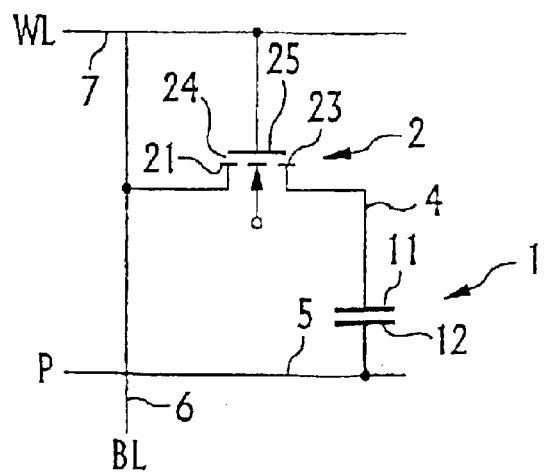
FIG 16

SEMICONDUCTOR MEMORY CELL CONFIGURATION AND A METHOD FOR PRODUCING THE CONFIGURATION

CROSS-REFERENCE TO RELATED APPLICATION

This application is a continuation of copending International Application No. PCT/DE01/02798, filed Jul. 23, 2001, which designated the United States and was not published in English.

BACKGROUND OF THE INVENTION

Field of the Invention

The invention relates to a semiconductor memory cell configuration with dynamic memory cells, DRAMs for short, that in each case have a selection transistor and a memory capacitor. In the case of such a DRAM cell configuration, the information is stored in the memory cell in the form of electric charges, the memory states "0" and "1" respectively corresponding to a positively and negatively charged memory capacitor. The selection transistor and the memory capacitor of the memory cell are connected to one another in this case such that when the selection transistor is driven through a word line the charge of the capacitor can be read in and out through a bit line. The main outlay in the development of the technology of DRAM cell configurations lies in creating reliably operating DRAMs with a high packing density, that is to say, a low space requirement per memory cell. It is particularly important in this case that the memory capacitor has a memory capacity that ensures an adequate read signal and is, however, insensitive to α particles. To ensure satisfactory memory capacity even in the case of a small cell area, memory capacitors have been developed that use the third dimension. Such three-dimensional memory capacitors are configured chiefly in the form of trench capacitors that are produced such that there is etched into the semiconductor substrate a trench that is filled up with a dielectric layer and a first memory electrode, the semiconductor substrate serving as second memory electrode. The selection transistor of the DRAM cell is usually constructed on the planar semiconductor surface next to the trench capacitor. Such a cell configuration with a trench capacitor and a planar selection transistor requires at least a chip area of $8F^2$, F representing the minimum pattern size that can be produced by lithography with the technology in use. To be able to increase further the packing density of the DRAM cells, from generation to generation of memories the pattern size F has been reduced, on one hand, and the overall chip area has been enlarged, on the other hand. However, problems arise in the case of this DRAM development because of excessively low chip yield, extreme rises in costs being due to the downscaling of patterns in the chip production and ever-smaller ratios of capacitor capacitance to bit line length. For this reason, attempts are also being made in developing the technology of DRAMs to downscale the cell area of the DRAMs in order to be able to increase the packing density. One possibility for downscaling the cell size of the DRAM lies in this case of configuring the selection transistor in three dimensions in a way similar to the memory capacitor. Various DRAM cell concepts are already known in which a trench capacitor is connected to a selection transistor constructed substantially vertically as a MISFET. In the case of the known DRAM cell configurations with a vertical MISFET transistor and trench capacitor, there is the problem, however, that the active zone between the source electrode and the drain electrode is influenced by a word or bit line, adjacent to the DRAM cell, that is not used to control the relevant DRAM cell. This can lead, in particular, in the case of the small pattern sizes of the DRAMs, to a leakage current through the active zone of the MISFET and, thus, to a loss of information in the memory cell. To exclude influencing of the active zone of a vertical MISFET transistor, and thereby to prevent leakage currents, U.S. Pat. No. 5,519,236 to Ozaki proposes a semiconductor memory cell configuration in which the active zone between the source electrode and the drain electrode of the vertical selection transistor is completely surrounded by a gate structure. As a result, the active zone is shielded from adjacent word and/or bit lines. The known cell configuration is constructed in this case such that trenches and pillars are executed in a configuration with the pattern of a chessboard in the semiconductor substrate, the memory capacitor being executed in a trench, and the associated selection transistor being executed vertically in an adjacent pillar, and a gate electrode layer completely surrounding the active layer of the selection transistor. The gate electrode layer can, in this case, be part of a word line assigned to the DRAM. A bit line of the DRAM cell is, furthermore, disposed such that it runs, in a fashion offset perpendicularly from the trench capacitor, over the column of the associated vertical selection transistor, and is connected to the source electrode thereof. The chessboard pattern used in Ozaki for configuring the DRAM cells has, however, a large space requirement such that the maximum packing density of the DRAM cells on the semiconductor substrate remains limited. Furthermore, in the case of the design of the DRAM cell in accordance with Ozaki, it is necessary for the purpose of patterning the word line to carry out a plurality of complicated lithography steps with mask processes that, in turn, necessitate a specific minimum cell size and, thereby, greatly limit the maximum packing density of the DRAM cell configuration.

International Application WO 00/33383, corresponding to United States Patent Pub. 2002/017,671 A1 to Goebel et al., exhibits a classic configuration of memory cells with vertical transistors, in the case of which the active regions are surrounded by the electrodes of the source regions and drain regions and not by the layers forming the word lines whereas, in a way similar to Ozaki, the configuration has a distribution of the trench capacitors in the form of a chessboard pattern. Memory cell configurations of the type with a chessboard pattern and with trench capacitors are also described in Japanese Patent Document 05-291528 to Matsuo et al. Configurations, in the form of a chessboard, of vertical transistors for driving capacitors are exhibited in U.S. Pat. No. 4,937,641 to Sunami et al. and U.S. Pat. No. 4,967,247 to Kaga et al.

SUMMARY OF THE INVENTION

It is accordingly an object of the invention to provide a semiconductor memory cell configuration with dynamic memory cells and a method for producing the configuration that overcome the hereinafore-mentioned disadvantages of the heretofore-known devices and methods of this general type and that renders possible a high packing density, that is to say, a low space requirement per DRAM cell.

With the foregoing and other objects in view, there is provided, in accordance with the invention, a semiconductor memory cell configuration, including bit lines, word lines, dynamic memory cells disposed in a matrix and having trench capacitors and vertical selection transistors, each of the dynamic memory cells having a trench capacitor having a block-shaped inner electrode, a dielectric intermediate layer surrounding the inner electrode, and an outer electrode in contact with the dielectric intermediate layer, a vertical selection transistor disposed substantially above the trench capacitor and having a layer sequence disposed offset from the inner electrode of the trench capacitor, the layer sequence having a first electrode connected to a respective one of the bit lines, an active intermediate layer, and a second electrode connected to the inner electrode of the trench capacitor, an insulating layer, and a gate electrode layer connected to a respective one of the word lines, the gate electrode layer and the insulating layer completely surrounding the active intermediate layer, the one word line and the one bit line crossing one another, and the trench capacitors and associated ones of the vertical selection transistors of the dynamic memory cells being disposed in rows respectively along the bit lines and in columns respectively along the word lines directly following one another and in each case with a substantially equal spacing from the bit lines.

In accordance with the invention, the dynamic memory cells with the trench capacitor and the associated selection transistor are respectively disposed following one another in the form of rows and/or columns. Such a configuration yields the maximum possible packing density of the DRAM cells in three-dimensional space, and, so, the cell areas for the individual DRAM cells may be reduced to an area of size $4F^2$ to $6F^2$, F corresponding to the minimum pattern size of the lithography process used. Moreover, a maximum expansion of the cross-section of the trench capacitors in relation to the cell area of the individual DRAM cells is possible due to the matrix configuration of the DRAM cells. As a result, it is possible to achieve improved capacitance values of the trench capacitors.

In accordance with another feature of the invention, the trench capacitors have trenches, the vertical selection transistor has a channel in the active intermediate layer, and the active intermediate layer is disposed substantially between trenches of adjacent trench capacitors.

In accordance with a further feature of the invention, the dynamic memory cells are constructed to substantially dispose the vertical selection transistor as a first column and substantially dispose the trench capacitor as a second column.

In accordance with an added feature of the invention, there are provided a semiconductor substrate having a buried highly doped plate, the trench capacitors being disposed in the semiconductor substrate both equally spaced in an x-direction and equally spaced in a y-direction, the dielectric intermediate layer lining the trenches, a substantially block-shaped highly doped semiconductor layer filling up the trenches as an inner electrode, an insulating layer covering the trenches, and the dielectric intermediate layer being in contact with the buried highly doped plate as an outer electrode.

In accordance with an additional feature of the invention, the trenches of the trench capacitors have a cross-sectional shape selected from a group consisting of oval, rectangular, and square.

In accordance with yet another feature of the invention, the inner electrode has an upper end, the vertical selection transistor is a MISFET transistor having, in a region of the upper end, the second electrode as a highly doped layer on which a weakly doped layer is disposed as an active region, and the first electrode is a highly doped layer, a conductive connection is formed between the second electrode of the MISFET transistor and the inner electrode of the trench capacitor through the dielectric intermediate layer.

In accordance with yet a further feature of the invention, between the second column of one of the MISFET transistors belonging to the trench capacitor and the second column of another of the MISFET transistors belonging to the trench capacitor following thereupon, there is disposed on the insulating layer covering the inner electrode of the trench capacitor a gate electrode layer sequence extending substantially around an entirety of the active region of the MISFET transistor, the gate electrode layer having a gate dielectric layer, a gate electrode layer, and a conducting layer serving as the word line.

In accordance with yet an added feature of the invention, the vertical selection transistor forms a pillar, a supporting column is spacer-technique constructed between ones of the vertical selection transistors belonging to the same one of the word lines and, in each case, to consecutive ones of the bit lines to form spacer patterns surrounding the supporting column and extending parallel to the pillar, and the gate electrode layer sequence is respectively disposed between the pillar of the vertical selection transistor and the supporting column of the gate electrode layer sequence.

With the objects of the invention in view, there is also provided a method for producing a semiconductor memory cell configuration with bit lines, word lines, and dynamic memory cells that in each case have a trench capacitor and a vertical selection transistor, including the steps of forming trench capacitors in a matrix, the trench capacitors and associated ones of the vertical selection transistors of the dynamic memory cells respectively directly following one another in rows and in columns, each trench capacitor having a trench, a block-shaped inner electrode, a dielectric intermediate layer, and an outer electrode, the dielectric intermediate layer being formed in the trench and the inner electrode being subsequently introduced into the trench, forming vertical selection transistors substantially above each of the trench capacitors, each vertical selection transistor having a layer sequence disposed offset from the inner electrode of a respective trench capacitor, the layer sequence having a first, upper electrode, an active intermediate layer, and a second, lower electrode, the second, lower electrode being connected to the inner electrode of the respective trench capacitor, and the first, upper electrode being connected to a respective one of the bit lines, forming an insulating layer as gate oxide around the active intermediate layer, the insulating layer completely surrounding the intermediate layer, depositing a gate electrode layer on the insulating layer and forming a respective one of the word lines from selection transistors along the columns adjacent to the gate electrode layer, and forming a respective bit line along rows that cross a word line.

In accordance with yet an additional mode of the invention, the three-dimensional dense packing of the individual DRAM cells can be achieved by virtue of the fact that the trench capacitor and the associated vertical selection transistor of the dynamic memory cells are formed substantially under an associated bit line. This yields the possibility of constructing the individual DRAM cells closely next to one another and simultaneously of ensuring a reliable shielding of the active zones of the selection transistors from adjacent word and bit lines by enclosing these active zones with the aid of the gate electrode structure.

In accordance with again another mode of the invention, the regions with the vertical selection transistors, and the connection of the latter to the associated trench capacitors, are defined with the aid of the spacer technique, which renders it possible for these regions to be fixed in a self-adjusting fashion, and, thus, for there to be minimal pattern sizes for the DRAM cells.

In accordance with again a further mode of the invention, the vertical selection transistors are defined, in particular, by spacers with differently doped regions such that a self-adjusting definition of the vertical selection transistors is yielded with the aid of selective etching processes relating to the different doping. Furthermore, it is possible, thereby, for a connecting region between the lower electrode of the selection transistor and the inner electrode of the trench capacitor to be fixed precisely in a reliable fashion.

In accordance with again an added mode of the invention, the lower electrodes of the selection transistors are produced by doping implantation and outdiffusion, the conducting connection to the inner electrode of the trench capacitor also being doped, and, thus, a self-adjusting connection being produced.

In accordance with again an additional mode of the invention, the patterning of the upper electrode of the selection transistors is performed with the aid of the trench isolation technique that ensures reliable insulation in conjunction with minimal process outlay.

The introduction of the gate electrode layer sequence around the active region of the selection transistors is carried out in accordance with still another mode of the invention with the aid of the spacer technique such that a self-adjusting and space-saving production of the word line regions is possible without lithographic processes.

In accordance with still a further mode of the invention, in order, in particular, to produce a staggered bit line connection, a supporting structure is constructed between the selection transistors, which belong in each case to consecutive bit lines, but to the same word line. These supporting structures are produced with the aid of the spacer technique such that they can be constructed to be self-adjusting and space saving.

In accordance with still an added mode of the invention, there are provided the steps of providing a semiconductor substrate, producing the trenches in the semiconductor substrate, constructing the trench capacitors in the trenches, forming the columns for the vertical selection transistor and for connecting vertical selection transistor to the associated trench capacitor with the aid of a spacer technique, producing a vertical layer sequence of the second, lower electrode, an active region, and the first, upper electrode of the vertical selection transistors, applying and etching back a conductive layer to form a gate electrode layer as spacer around an entirety of the active region of the vertical selection transistor, the gate electrode layers of adjacent ones of the vertical selection transistors touching one another and forming a word line, producing contacts to the first, upper electrodes, as source electrodes, of the vertical selection transistors, and constructing the bit lines.

In accordance with still an additional mode of the invention, there is provided the step of, before producing the trenches in the semiconductor substrate, growing the lower, second electrode of the vertical layer sequence for the vertical selection transistors onto the semiconductor substrate by epitaxial growth, a highly n-doped layer being formed for the second, lower electrode and being overgrown with a weakly doped layer for the active intermediate layer.

In accordance with another feature of the invention, there is provided the step of, before producing the trenches in the semiconductor substrate, forming the second, lower electrode of the vertical layer sequence for the vertical selection transistors by an implantation, n-dopant being introduced as buried layer into the semiconductor substrate.

In accordance with a further mode of the invention, there is provided the step of, after producing the trenches in the semiconductor substrate, forming the second, lower electrode of the vertical layer sequence for the vertical selection transistor by outdiffusion of dopant from the inner electrode of the trench capacitor.

In accordance with an added mode of the invention, there is provided the step of defining the trenches with the aid of a photolithographic step to equally space the trenches in the semiconductor substrate in an x-direction and equally space the trenches in a y-direction, the trenches having a cross-sectional shape selected from a group consisting of oval, rectangular, and square.

In accordance with an additional mode of the invention, a process sequence is carried out to define regions with the vertical selection transistors and regions with a connection to the associated trench capacitors with the steps of producing a spacer structure in the trenches above the trench capacitors, performing one-sided doping of the spacer structure, splitting the spacer structure with the aid of a lithography step, and selectively etching the spacer structure based upon the differently doped spacer regions.

In accordance with yet another mode of the invention, there is provided the step of splitting the spacer with the aid of a hard-surface mask lithography process.

In accordance with yet a further mode of the invention, there is provided the step of outdiffusing dopant from the inner electrode to form outdiffusion in the second, lower electrode of the vertical selection transistor.

In accordance with yet an added mode of the invention, gate layer sequences are constructed in a process cycle having the steps of producing an insulating layer on the trench capacitors in the trenches, forming a gate dielectric layer, the gate electrode layer and a conducting layer serving as a word line around the pillars with the active region of the selection transistors, anisotropically etching the gate electrode layer and the conducting layer to form spacers, and depositing an insulating layer.

In accordance with yet an additional mode of the invention, there is provided the step of forming spacer patterns surrounding supporting pillars by constructing the supporting pillars with the aid of a spacer technique between the vertical selection transistors respectively belonging to consecutive ones of the bit lines, but to the same word lines.

In accordance with again another mode of the invention, there is provided the step of forming spacer patterns surrounding supporting pillars by constructing the supporting pillars with the aid of a spacer technique between the vertical selection transistors respectively belonging to consecutive ones of the bit lines and to a given same one of the word lines.

In accordance with again a further mode of the invention, there is provided the step of constructing a gate electrode layer sequence vertically between the supporting pillars and the pillars with the active region of the vertical selection transistor.

With the objects of the invention in view, there is also provided a method for producing a semiconductor memory cell configuration with dynamic memory cells that in each case have a trench capacitor and a vertical selection transistor, including the steps of forming bit lines and word lines in rows and columns, a respective bit line being formed along rows that cross a word line, forming trench capacitors in a matrix, the trench capacitors and associated ones of the vertical selection transistors of the dynamic memory cells respectively directly following one another in rows and in columns, each trench capacitor having a trench, a block-shaped inner electrode, a dielectric intermediate layer, and an outer electrode, the dielectric intermediate layer being formed in the trench and the inner electrode being subsequently introduced into the trench, forming vertical selection transistors substantially above each of the trench capacitors, each vertical selection transistor having a layer sequence disposed offset from the inner electrode of a respective trench capacitor, the layer sequence having a first, upper electrode, an active intermediate layer, and a second, lower electrode, the second, lower electrode being connected to the inner electrode of the respective trench capacitor, and the first, upper electrode being connected to a respective one of the bit lines, forming an insulating layer as gate oxide around the active intermediate layer, the insulating layer completely surrounding the intermediate layer, and depositing a gate electrode layer on the insulating layer and forming a respective one of the word lines from selection transistors along the columns adjacent to the gate electrode layer.

Other features that are considered as characteristic for the invention are set forth in the appended claims.

Although the invention is illustrated and described herein as embodied in a semiconductor memory cell configuration and a method for producing the configuration, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 2A, is a fragmentary, cross-sectional view of the configuration of FIG. 1A in a subsequent process step according to the invention along section line A—A in FIG. 2B;

FIG. 3A, is a fragmentary, cross-sectional view of the configuration of FIG. 2A in a subsequent process step according to the invention along section line A—A in FIG. 3B;

FIG. 3B is a fragmentary, plan view of the configuration of FIG. 3A;

FIG. 4A, is a fragmentary, cross-sectional view of the configuration of FIG. 3A in a subsequent process step according to the invention along section line A—A in FIG. 4B;

FIG. 7A, is a fragmentary, cross-sectional view of the configuration of FIG. 6A in a subsequent process step according to the invention along section line A—A in FIG. 7B;

FIG. 8A, is a fragmentary, cross-sectional view of the configuration of FIG. 7A in a subsequent process step according to the invention along section line A—A in FIG. 8B;

FIG. 9C is a fragmentary, cross-sectional view of the configuration of FIG. 9A along section line C—C in FIG. 9B;

FIG. 10A, is a fragmentary, cross-sectional view of the configuration of FIG. 9A in a subsequent process step according to the invention along section line A—A in FIG. 10B;

FIG. 10B is a fragmentary, plan view of the configuration of FIG. 10A;

FIG. 10C is a fragmentary, cross-sectional view of the configuration of FIG. 10A along section line C—C in FIG. 10B;

FIG. 11A, is a fragmentary, cross-sectional view of the configuration of FIG. 10A in a subsequent process step according to the invention along section line A—A in FIG. 11B;

FIG. 11B is a fragmentary, plan view of the configuration of FIG. 11A;

FIG. 15 is a fragmentary, plan view of a fourth embodiment of the configuration of FIG. 1B after the process step for producing the trench capacitors; and FIG. 16 is a schematic circuit diagram of a dynamic read/write memory according to the invention.

DESCRIPTION OF THE PREFERRED EMBODIMENTS

Figure 1A:
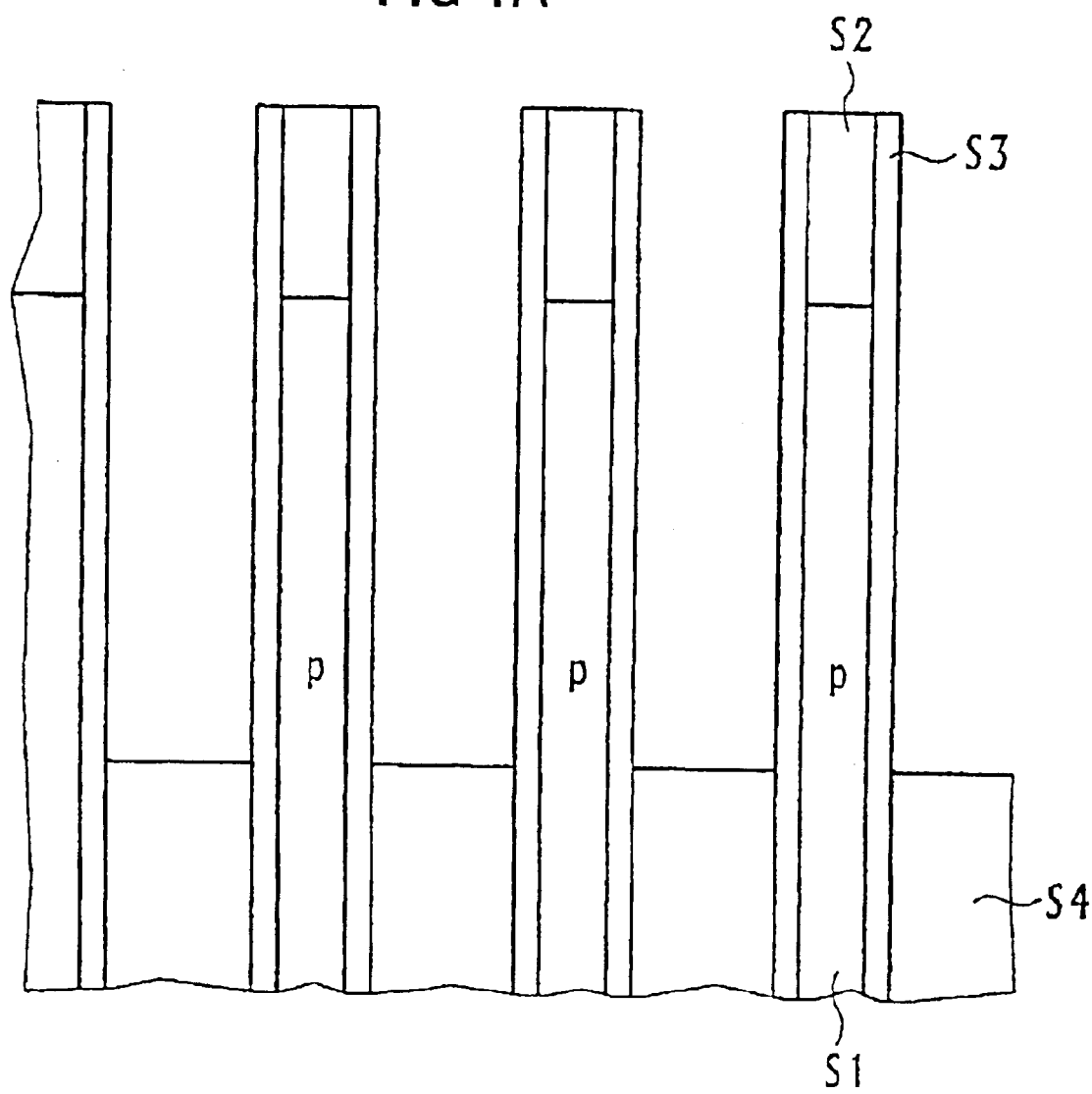
FIG. 1A is a fragmentary, cross-sectional view through trenches of memory capacitors of a first embodiment of a semiconductor memory cell configuration according to the invention along section line A—A in FIG. 1B.

It is preferred to make use in dynamic read/write memories (DRAMs) of so-called 1-transistor cells whose circuit diagram is shown in FIG. 16. Referring now to the figures of the drawings in detail and first, particularly to FIG. 16 thereof, there are shown 1-transistor cells including a memory capacitor 1 and a selection transistor 2. The selection transistor 2 is, preferably, configured in this case as a field effect transistor. The field effect transistor has a first electrode 21 and a second electrode 23, between which there is disposed an active region 22 (see FIGS. 12A, 12B, and 12C) in which it is possible to construct a current-conducting channel between the first electrode 21 and the second electrode 23. Disposed above the active region 22 is an insulating layer 24 and a gate electrode 25 that can act as a plate capacitor that can be used to influence the charge carrier density in the active region 22. The field effect transistor 2, also abbreviated below as MISFET, is of the enhancement type here, that is to say, a flow of current between the first electrode 21 and the second electrode 23 through the active zone 22 is not set up until the application of a threshold voltage across the gate electrode 25.

The second electrode 23 of the MISFET 2 is connected through a connecting line 4 to a first electrode 11 of the memory capacitor 1. The second electrode 12 of the memory capacitor 1 is connected, in turn, to a capacitor plate 5 that is, preferably, common to all the memory capacitors of the DRAM cell configuration. The first electrode 21 of the MISFET 2 is connected to a bit line 6 to be able to read in and out the information stored in the memory capacitor 1 in the form of charges. The read-in and read-out operation is controlled in this case through a word line 7 that is connected to the gate electrode 24 of the MISFET 2 to, by applying a voltage, produce a current-conducting channel in the active zone 22 between the first electrode 21 and the second electrode 23.

Figure 12:
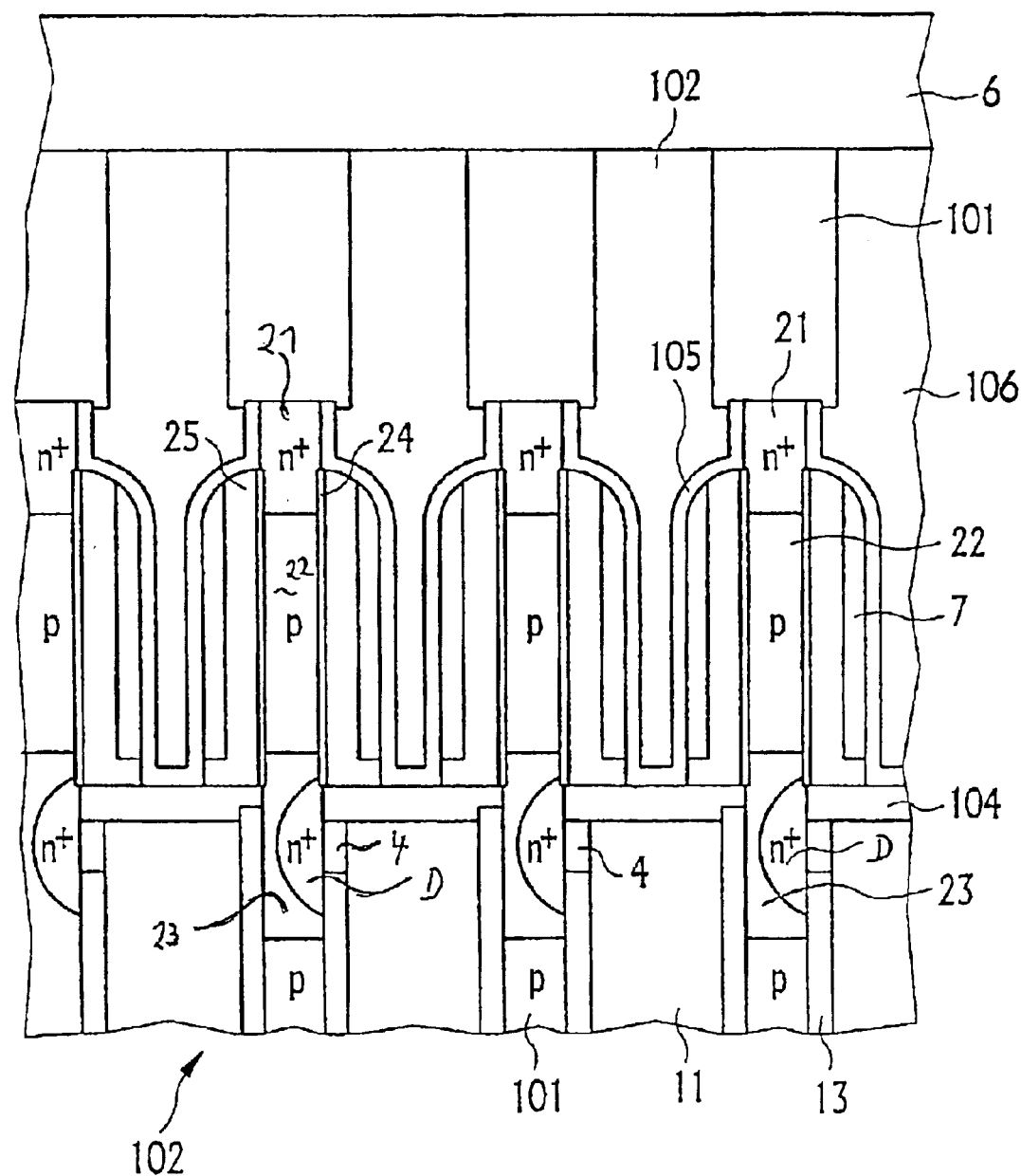
FIG. 12A, is a fragmentary, cross-sectional view of the configuration of FIG. 11A in a subsequent process step according to the invention along section line A—A in FIG. 12B.
FIG. 12B is a fragmentary, plan view of the configuration of FIG. 12A.
FIG. 12C is a fragmentary, cross-sectional view of the configuration of FIG. 12A along section line C—C in FIG. 12B.
Figure 12B:
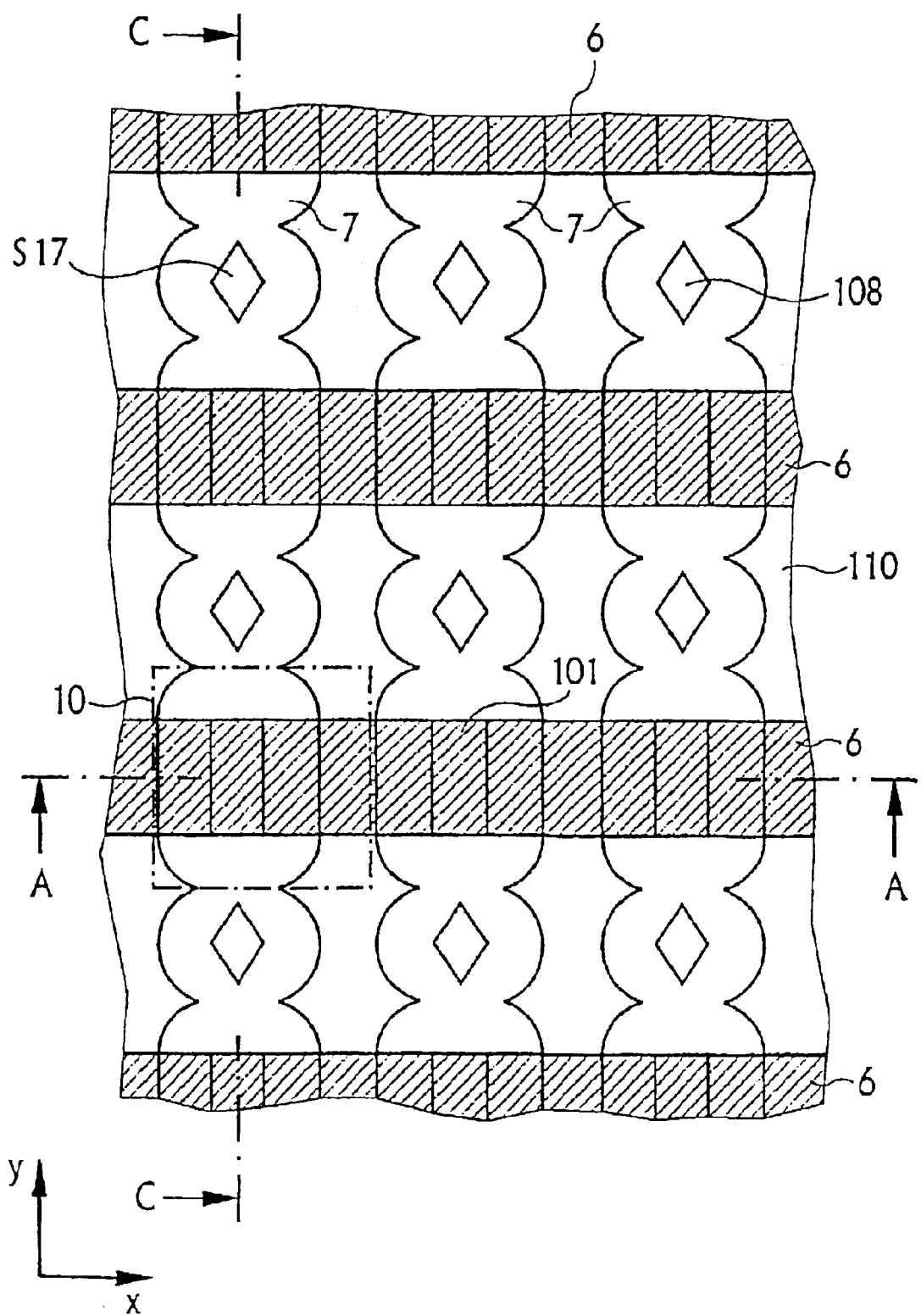
Figure 12C:
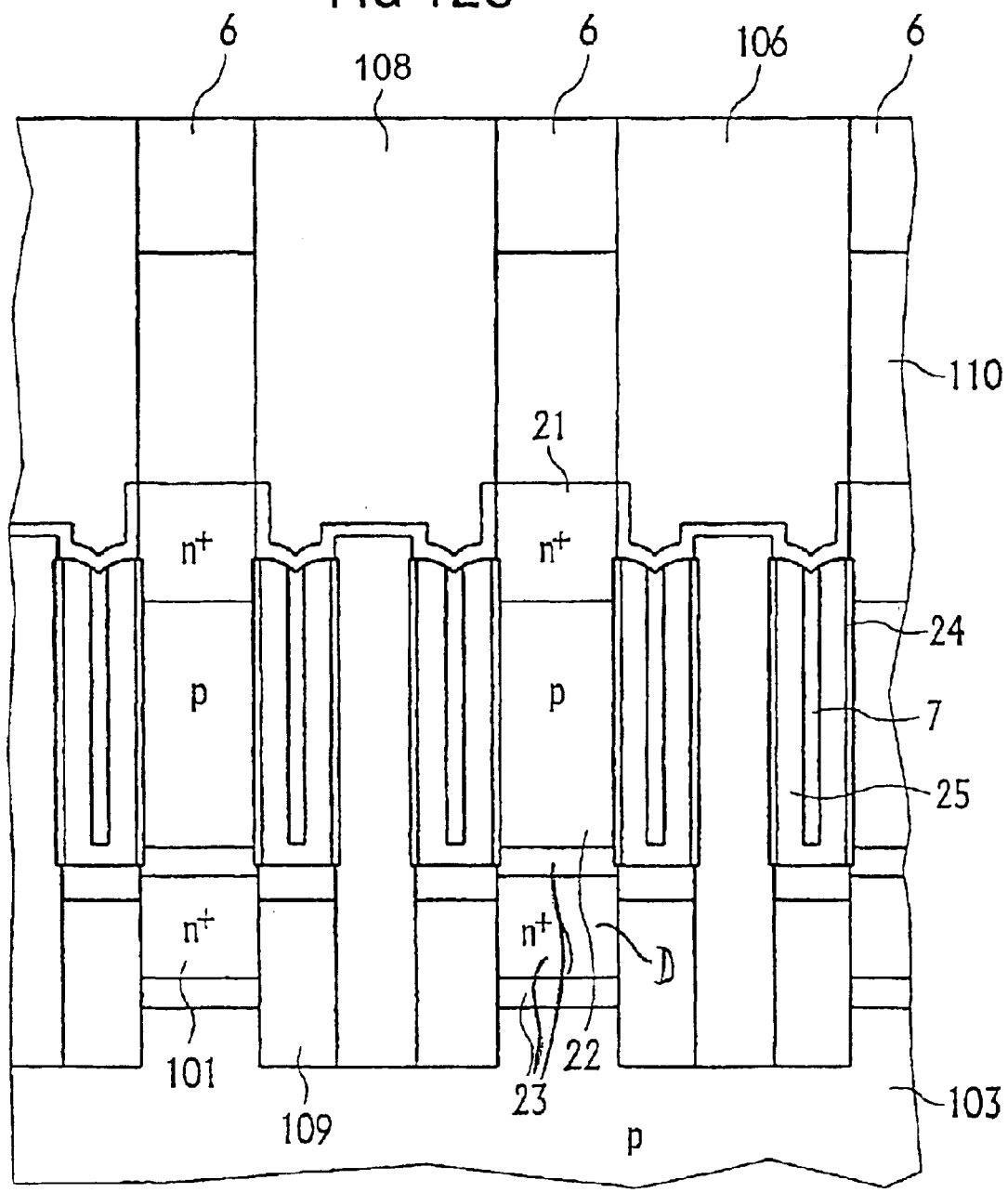

FIGS. 12A, 12B, and 12C show a first embodiment according to the invention of a semiconductor memory cell configuration with DRAM cells as illustrated in the circuit diagram according to FIG. 16. In the embodiment shown, the minimal pattern size F that can be produced with the aid of the lithography technique described is 0.1 $\mu$m. This means that the bit and word lines and the contact holes generally have a width of approximately 0.1 $\mu$m. However, it must be borne in mind that the figures illustrated are not true to scale. Moreover, the invention is not limited to these pattern sizes. In the plan view shown in FIG. 12B of the semiconductor memory cell configuration, the dashed line defines a DRAM cell 10. These DRAM cells 10 are disposed substantially longitudinally below bit lines 6 that run equidistantly at a spacing on the memory configuration in the x-direction. Running perpendicular to these bit lines 6 in a y-direction in a fashion buried in the semiconductor substrate and, likewise, at equidistant spacings, are word lines 7 that intercept the bit lines 6 in the region of the DRAM cells 10 in each case. FIG. 12A shows a cross-section through the semiconductor cell configuration along a bit line 6, and FIG. 12C shows the cross-section through the semiconductor cell configuration along a word line 7. The DRAM cells, which are substantially aligned along the bit line 6, are composed of pillars 101, in which the MISFET selection transistors 2 are substantially constructed, and trenches 102, in which the memory capacitors 1 are substantially constructed.

The cell configuration shown is produced using silicon semiconductor technology, a weakly doped p-substrate serving as base. Executed in this p-semiconductor substrate 103 is a non-illustrated buried plate in the form of a strong n-dopant that serves as a common second outer electrode 12 for all the trench capacitors of the cell configuration. As is shown in FIG. 12A, there are constructed in the semiconductor substrate equally spaced trenches that make contact with the buried n-doped plate and can have any desired shape, but are, preferably, oval or rectangular in construction. These trenches are lined in their lower part with a dielectric layer 13 and filled up with n-doped polysilicon in this region. The n-doped polysilicon filling constitutes the first inner electrode 11 of the memory capacitor 1. It is preferred to use $SiO_2$ as dielectric layer 13 in the trench for the purpose of insulating the electrodes. The MISFET selection capacitors 2 are, respectively, constructed in the semiconductor pillars 101 between the trenches that, as is shown by the cross-section according to FIG. 12A, extend below the bit line 6. Such a MISFET transistor has the second electrode 23 in the form of a highly doped n-layer in the region of the upper end of the polysilicon layer 11 in the trench, that is to say, the inner electrode of the trench capacitor. The active layer 22, which is weakly p-doped, is, then, constructed on this n-layer. The first electrode 21 is applied, in turn, as a highly doped n-layer to the active region 24. A conducting connection 4 is formed through the dielectric layer 13 lining the trench between the second electrode 23 of the MISFET transistor 2 and the inner electrode 11 of the trench capacitor 1. The connection 4 is formed between the second electrode 23 of the selection transistor 2 and the inner polysilicon electrode 11 of the memory capacitor 1 and, in this case, preferably, includes an n-doped polysilicon layer.

Furthermore, introduced vertically on an insulating layer 104, which is applied to the inner electrode 11 of the trench capacitor, between the pillar of the selection transistor belonging to the trench capacitor and the pillar of the selection transistor belonging to the trench capacitor following thereupon, is a layer sequence that substantially extends over the entire active region 22 of the selection transistor and is of a thin gate insulating layer 24, preferably, of $SiO_2$, a gate electrode layer 25, preferably, of polysilicon, and a further current-conducting layer, preferably, of tungsten, which serves as word line 7. As shown by the cross-sections along the bit line in FIG. 12A and the word line in FIG. 12C, such a layer sequence encloses the pillar of the selection transistor around the entire active region 24. The gate electrode layer sequence around the active region 24 of the selection transistor 2 is bounded by an insulating layer 105, preferably, of $Si_3N_4$, that extends along the selection transistor 2 from the upper electrode 21 through the gate electrode layer sequence as far as the insulating layer 104 on the inner electrode 11 of the trench capacitor 1. The region between the insulating layers 105, which delimit the gate electrode layer sequences of adjacent DRAM cells in the region of a trench, is, preferably, filled up by an $SiO_2$ layer 106. Reciprocal influencing of the active zones of consecutive selection transistors is reliably prevented by the surrounding gate. This means that no corresponding leakage currents can occur through the active zones of the MISFETs, and, thus, that no information losses can occur in the memory cells. As the cross-section in FIG. 12C shows, a supporting pillar 108 is constructed between consecutive pillars with the selection transistors on the semiconductor substrate between the selection transistors that respectively belong to consecutive bit lines 6 but to the same word line 7. This supporting pillar 108, in this case, preferably, extends parallel to the pillar 101 with the selection transistor, there being constructed in each case between a pillar 101 of the selection transistor and a supporting pillar 108, which preferably, is of polysilicon, a layer sequence in the case of which an insulating layer 109 of $SiO_2$ runs up to the level of the active region 24 of the selection transistor, and on which the gate electrode layer sequence is, then, disposed vertically, and which is subsequently covered by the insulating layer 105 that extends beyond a supporting pillar 108 between two consecutive selection transistor pillars. The upper electrode 21 of the selection transistor 2 is connected, furthermore, to the associated bit line 6 through a pillar-like current-conducting layer 110. The current-conducting layer 110, preferably, is of polysilicon, and the bit line 6 of tungsten. The free space between the bit lines is filled up by the $SiO_2$ layer 106. The semiconductor memory cell configuration according to the invention, as it is shown in the exemplary embodiment according to FIG. 12, is distinguished in that the DRAM memory cells 10 are disposed in matrix form, the DRAM cells being configured such that the vertical selection transistor 2 and the trench capacitor 1 run respectively below the associated bit line 6, and the memory cells are respectively disposed in the form of rows one below another. A maximal three-dimensional packing density of the DRAM cells can be produced, and, thus, a cell configuration with a minimum cell area can be achieved by this configuration. Furthermore, it is ensured in the case of the configuration according to the invention that the active region of the selection transistors is completely surrounded by the gate electrode layer sequence and the associated word line 7, such that it is possible to avoid influence exerted by adjacent word and bit lines that do not belong to the relevant DRAM cell. In the exemplary embodiment according to FIG. 12, a minimum spacing is possible between two adjacent word lines of 2F (F corresponding to the minimum pattern size). In the exemplary embodiment shown in FIG. 12, it is also possible to interconnect the DRAM cells by constructing the supporting pillars 108 between adjacent bit lines, it always being possible for two bit lines to be staggered with one another. In accordance with the invention, a minimum cell size of $5F^2$ to $6F^2$ can be achieved given a staggered bit line interconnection. Instead of the staggered bit line interconnection shown in FIG. 12, the invention can also be applied to other known bit line interconnections.

Figure 13A:
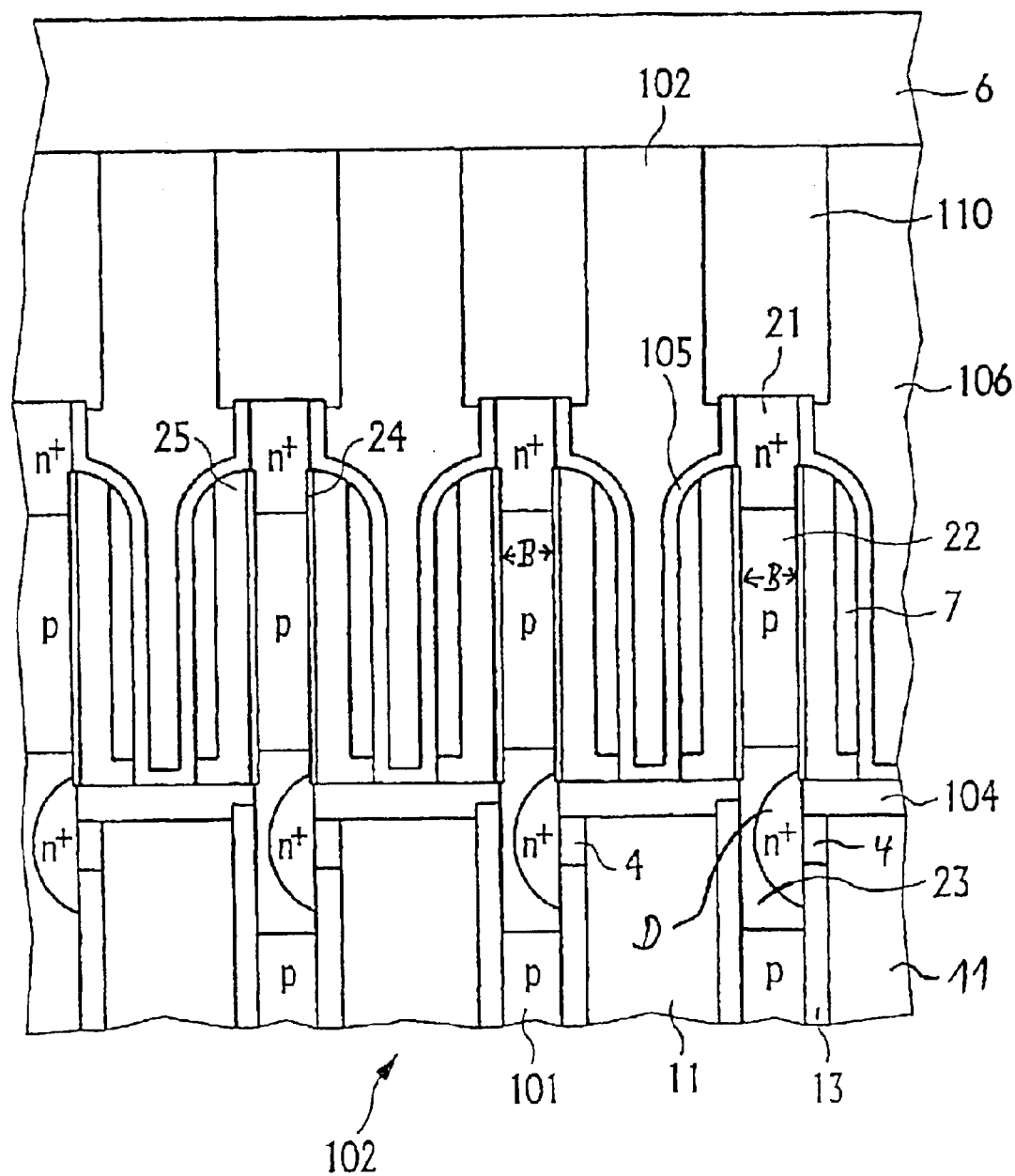
FIG. 13A, is a fragmentary, cross-sectional view of the configuration of FIG. 11A in a subsequent process step of a second embodiment of the semiconductor memory cell configuration for a so-called open bit line interconnection according to the invention along section line A—A in FIG. 13B.
Figure 13B:
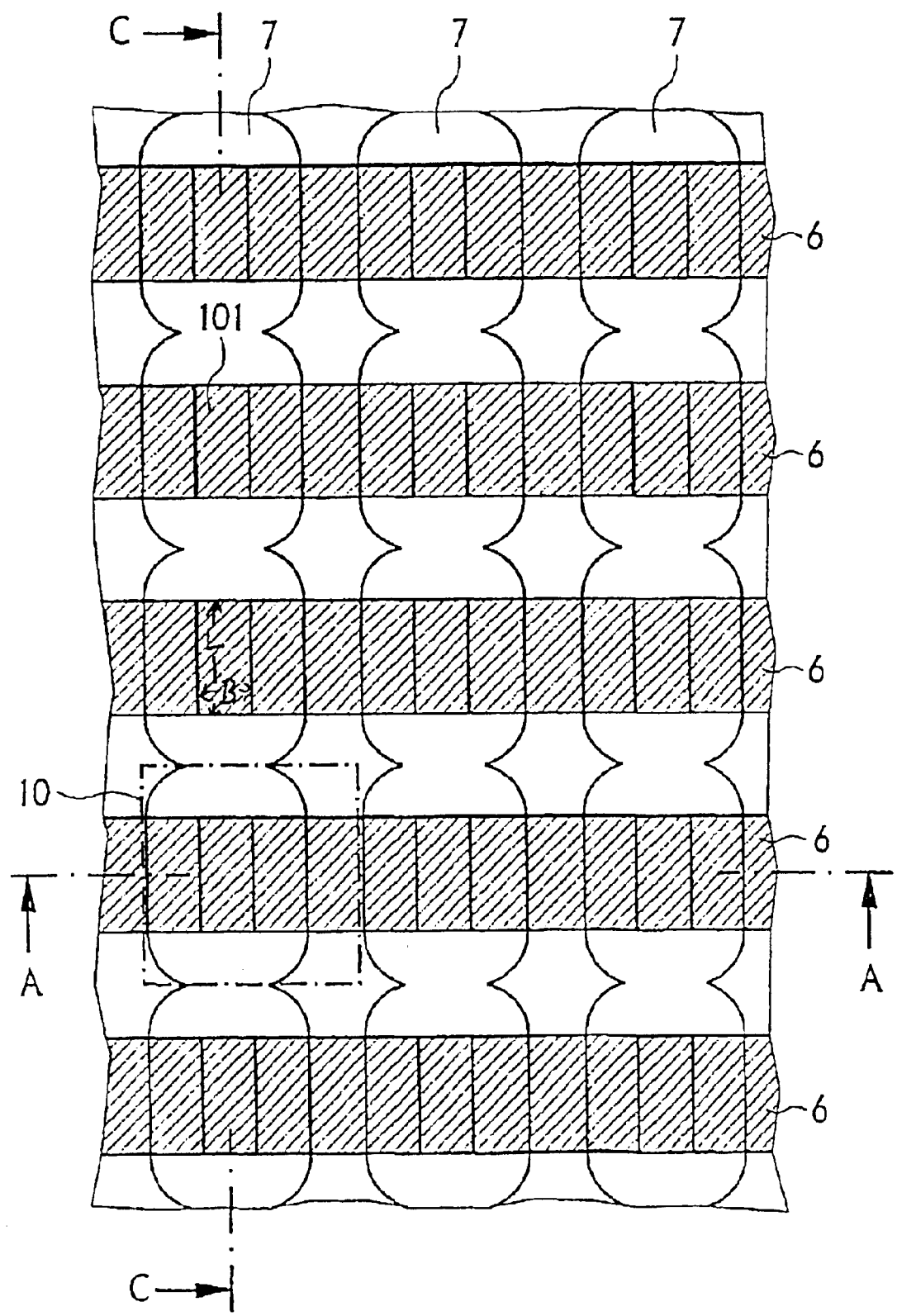
FIG. 13B is a fragmentary, plan view of the configuration of FIG. 13A.

FIG. 13B shows a plan view of a semiconductor memory cell configuration for a so-called open bit line interconnection. With this second embodiment, the supporting structure shown in FIG. 12 is eliminated such that, although in the case of a cross-section along a bit line 6 as illustrated in FIG. 13A the same cross-section is yielded as in the case of the first embodiment in FIG. 12A, a cross-section as shown in FIG. 13C results along a word line.

Figure 13C:
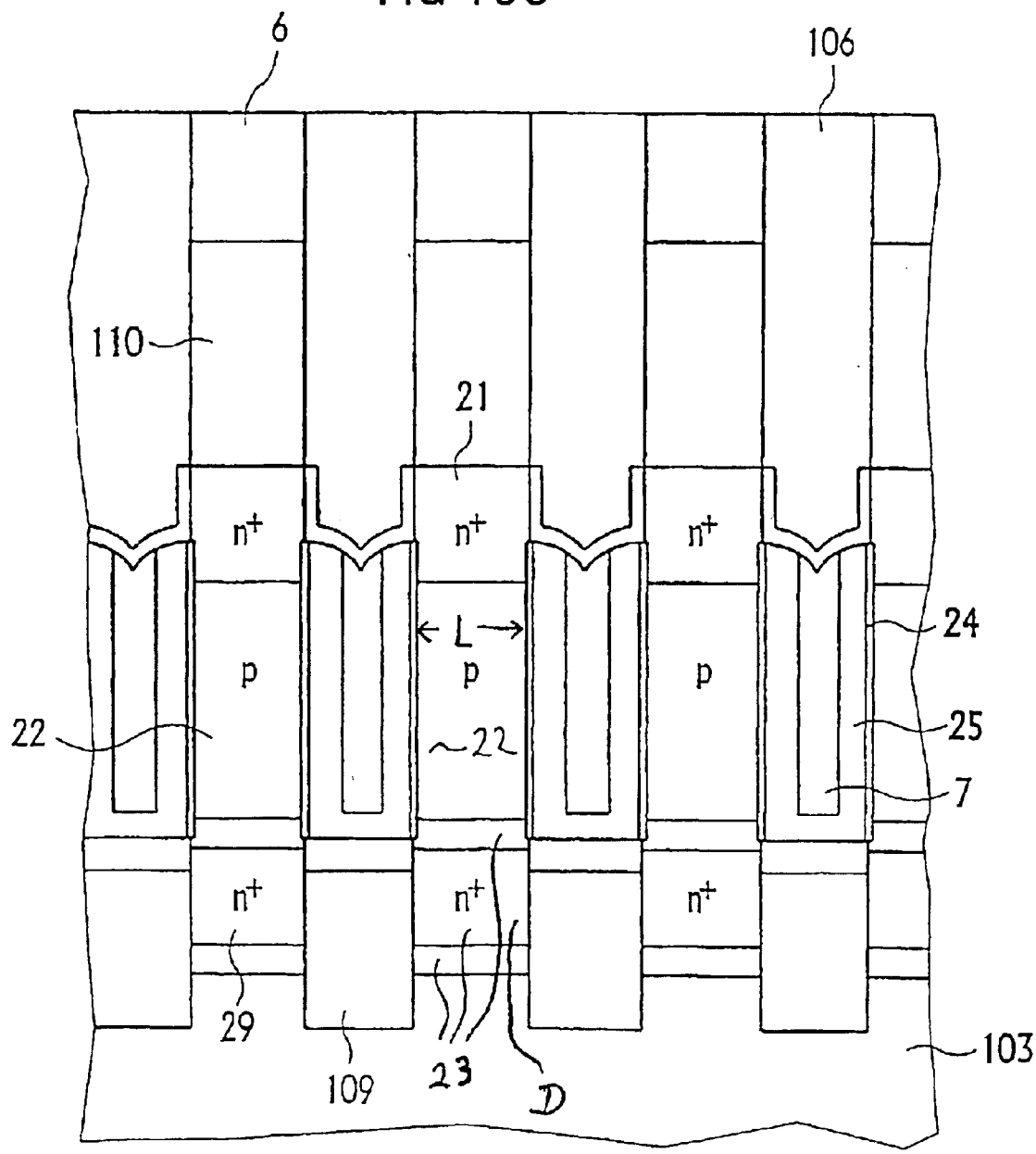
FIG. 13C is a fragmentary, cross-sectional view of the configuration of FIG. 13A along section line C—C in FIG. 13B.

In the cross-section shown in FIG. 13C, there is constructed along a word line 7 between two selection transistors that belong to adjacent bit lines 6 a layer sequence in which there is disposed in each case on the $SiO_2$ layer 109 around the active layer of the selection transistors a gate electrode layer sequence with the gate dielectric 24 and the gate electrode layer 25 that is respectively connected to the layer for the word line 7. A minimum cell size of $4F^2$ to $5F^2$ is possible by this configuration.

A possible process sequence for producing a semiconductor memory cell configuration as illustrated in FIG. 12 is described in detail with the aid of FIGS. 1 to 11. The starting material is a p-doped silicon substrate S1. After several cleaning steps, a non-illustrated $SiO_2$ layer with a thickness of approximately 8 nm is deposited on this starting material. An $Si_3N_4$ layer S2 with a thickness of approximately 200 nm is then produced on this oxide layer. An $SiO_2$ layer with a thickness of approximately 800 nm is applied, in turn, to this nitride layer. This layer sequence serves as masking layer for the following trench etching. A mask is, then, used to carry out photolithography to define the trench capacitors. After this photolithography process, anisotropic etching of the masking layer is performed, $CHF_3$ and $O_2$, for example, being used for oxide etching, and $C_2F_6$ and $O_2$ being used for nitride etching. After production of the etching mask for the trenches in which the memory capacitors are to be constructed, the resist mask for the photolithography is removed. The silicon layer is, then, etched anisotrophically down to a depth of approximately 10 $\mu$m with HBr and HF, in order to expose the trenches for the memory capacitors. Subsequently, a buried plate is formed in the silicon substrate for the common second electrode of the memory capacitors, use preferably being made of an arsenic glass. For such a purpose, an arsenic glass layer is, preferably, produced with a thickness of approximately 2 nm. A polymer photoresist, preferably, PMMA, with a thickness of approximately 500 nm is, then, produced on the arsenic glass layer and fills up the etched trenches. This polymer photoresist layer is, then, etched back outside the trenches to a thickness of approximately 2 $\mu$m, for example, with $O_2$. Subsequently, the arsenic glass above the polymer photoresist in the trenches is etched away, for example, with HF, and, then, the polymer photoresist layer in the trenches is removed, for example, with $O_2$. Arsenic is diffused from the arsenic glass into the p-doped silicon to produce a buried strongly n-doped layer that forms the common outer electrode of all the memory capacitors of the semiconductor memory cell configuration. The remaining arsenic glass is, then, removed with the aid of HF etching.

Figure 1B:
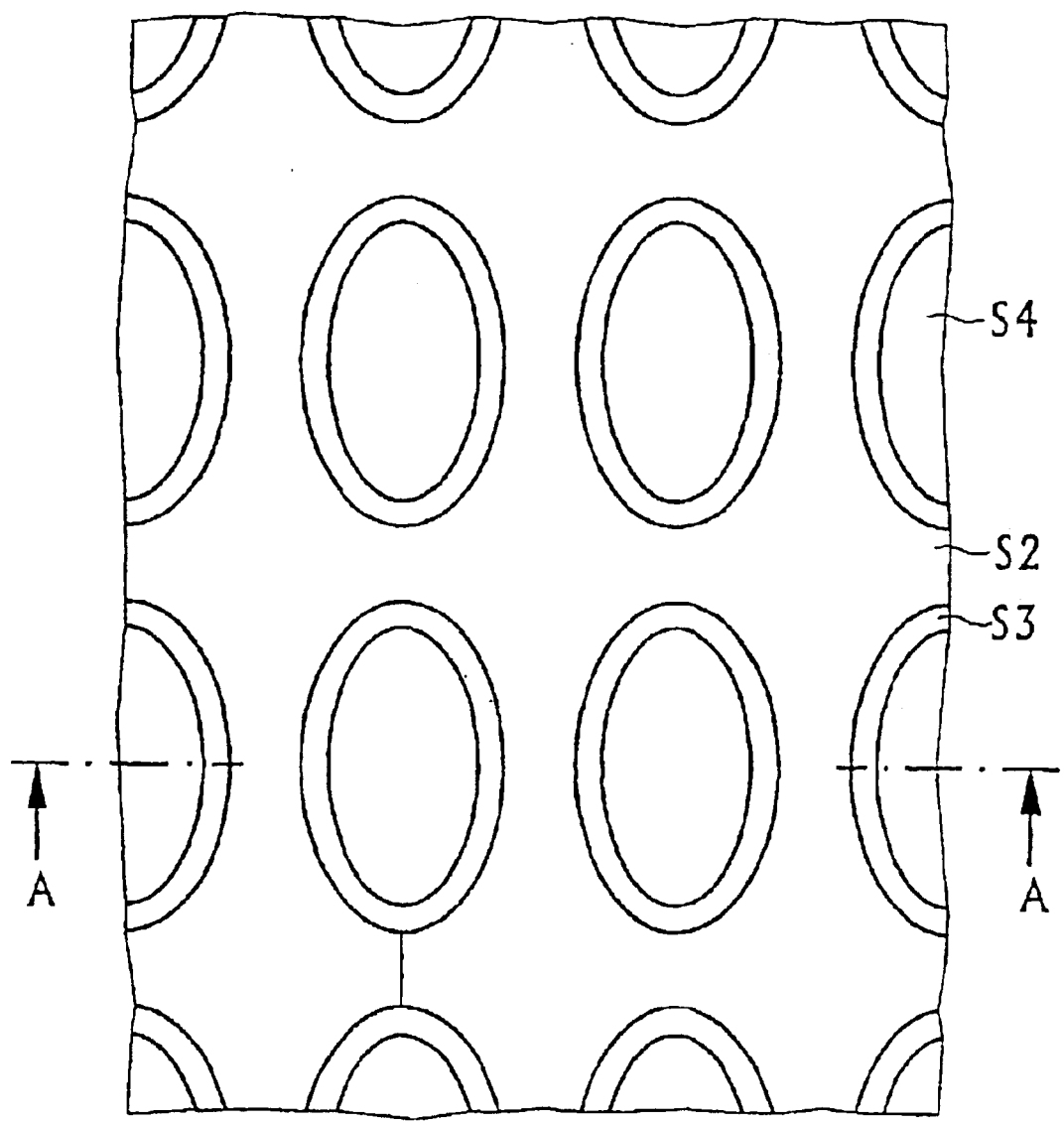
FIG. 1B is a fragmentary, plan view of the configuration of FIG. 1A.

To produce the dielectric layer of the memory capacitors in trenches, an Oxide Nitride Oxide (ONO) deposition is undertaken, a layer thickness S3 of approximately 3 nm being selected. Subsequently, the deposition of highly n-doped polysilicon S4 with a thickness of approximately 200 nm is performed to fill up the trenches. The projecting polysilicon outside the trenches is, subsequently, etched back. The ONO dielectric that projects above the trenches is removed with the aid of HF. Preferably using the TEOS method, an $SiO_2$ layer approximately 20 nm thick is, then, produced and etched away anisotrophy with $CHF_3$ and $O_2$ in the region of the trenches. Subsequently, highly doped polysilicon with a thickness of approximately 200 nm is deposited once again and etched back up to approximately 800 nm, thus producing a pattern in plan view as shown in FIG. 1B. FIG. 1A shows a cross-section along the line A—A through the trenches for the memory capacitors.

Figure 14:
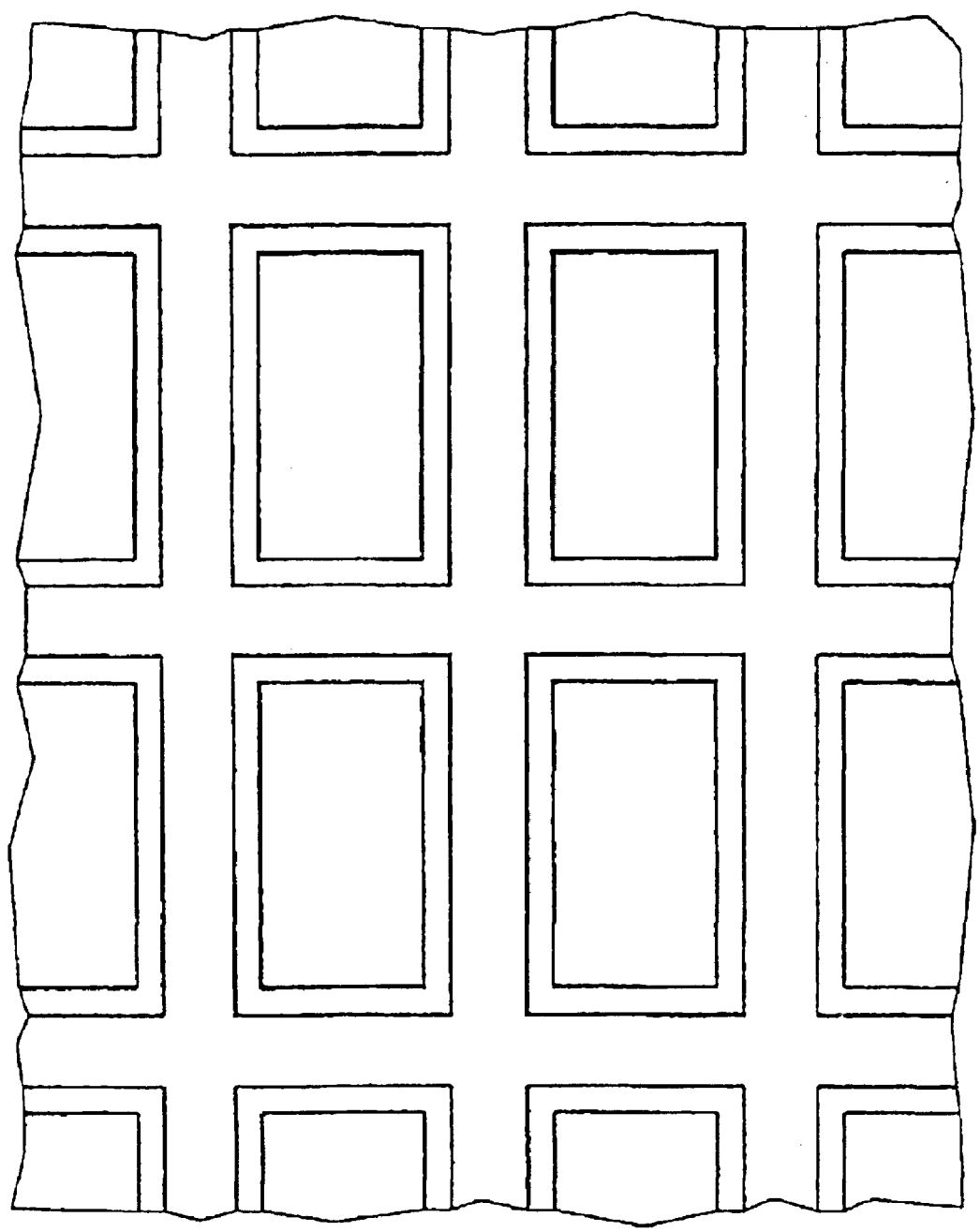
FIG. 14 is a fragmentary, plan view of a third embodiment of the configuration of FIG. 1B after the process step for producing the trench capacitors.

As an alternative to the oval shape, shown in FIG. 1B, of the trenches for the memory capacitors, it is also possible to produce trenches for the memory capacitors with a different shape such as is illustrated, for example in FIGS. 14 and 15. In particular, it is possible, thereby, to select trench shapes that render possible a relatively large surface of the side wall and, thus, an enlarged memory capacity of the capacitor.

For example, it is possible through the shape of the trenches of the trench capacitors to determine the shape of the ribs in which the vertical selection transistors are disposed. If the trenches are formed with a rectangular shape, the interspaces between the ribs with the selection transistors are, for example, smaller in the direction of the word line than in the direction of the bit lines. As a result, continuous and mutually separated word lines are formed by spacer deposition.

Figure 2B:
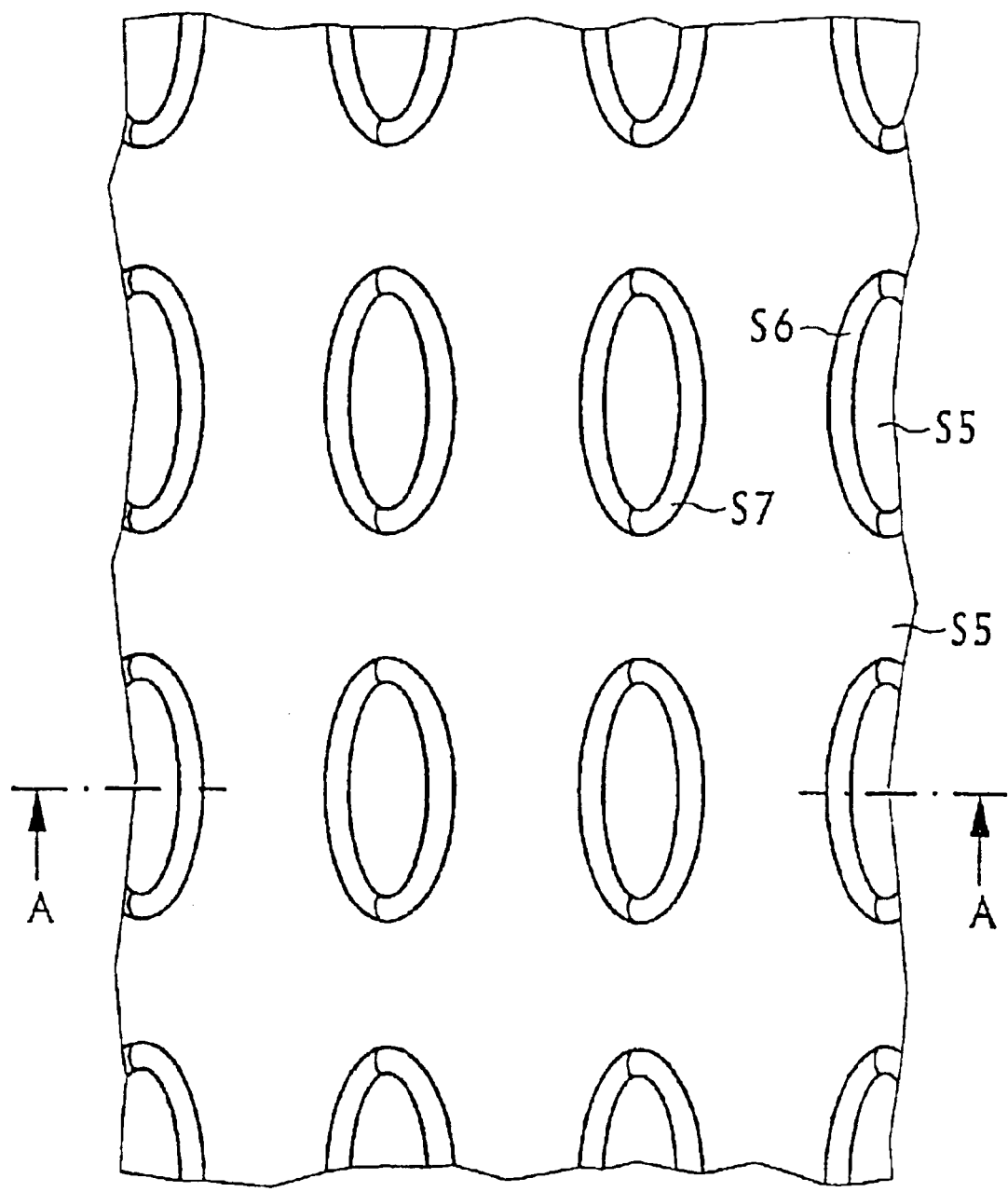
FIG. 2B is a fragmentary, plan view of the configuration of FIG. 2A.

After the construction of the memory capacitors in trenches in the semiconductor substrate as shown in FIGS. 1A and 1B, the selection transistors are patterned. The first step for this purpose is to apply a thin $Si_3N_4$ layer S5 with a thickness of approximately 4 nm. An undoped layer S6 of amorphous silicon with a thickness of approximately 20 nm is deposited on the $Si_3N_4$ layer S5. The amorphous silicon is, then, etched back, for example, with $C_2F_6$ and $O_2$, such that the amorphous silicon remains only at the side walls of the trenches and, thus, forms spacers. Subsequently, the spacers are highly doped on one side on the side walls in the trenches, it being possible to undertake both n-doping and p-doping. FIG. 2A and FIG. 2B show the silicon wafer after this last process step, the doping layer being denoted by S7.

A separation of the amorphous silicon spaces is now performed with the aid of a photolithography step. When the photolithography step is performed with the aid of the hard-surface mask method, the first step after the TEOS method is to apply an oxide layer S8 with a thickness of approximately 80 nm. This oxide is, then, patterned, for example, with the aid of $CHF_3$ and $O_2$ etching, and the amorphous silicon spacers S6, S7 are selectively removed, for example, with $C_2F_6$ and $O_2$, at the exposed sites. After this process step, a plan view of the semiconductor pattern is produced, as shown in FIG. 3B. It can be seen clearly here that the amorphous silicon spacers S6, S7 are removed in the exposed trench regions. FIG. 3A shows a cross-section through the silicon wafer along a remaining oxide path S8. After the selective etching of the amorphous silicon spacers S6, S7 in the trenches, the oxide S8 is completely removed, for example, with $CH_3$ and $O_2$. As an alternative to the outlined hard-surface mask photolithography process, it is also possible to use a conventional resist mask instead of the oxide mask.

Figure 4B:
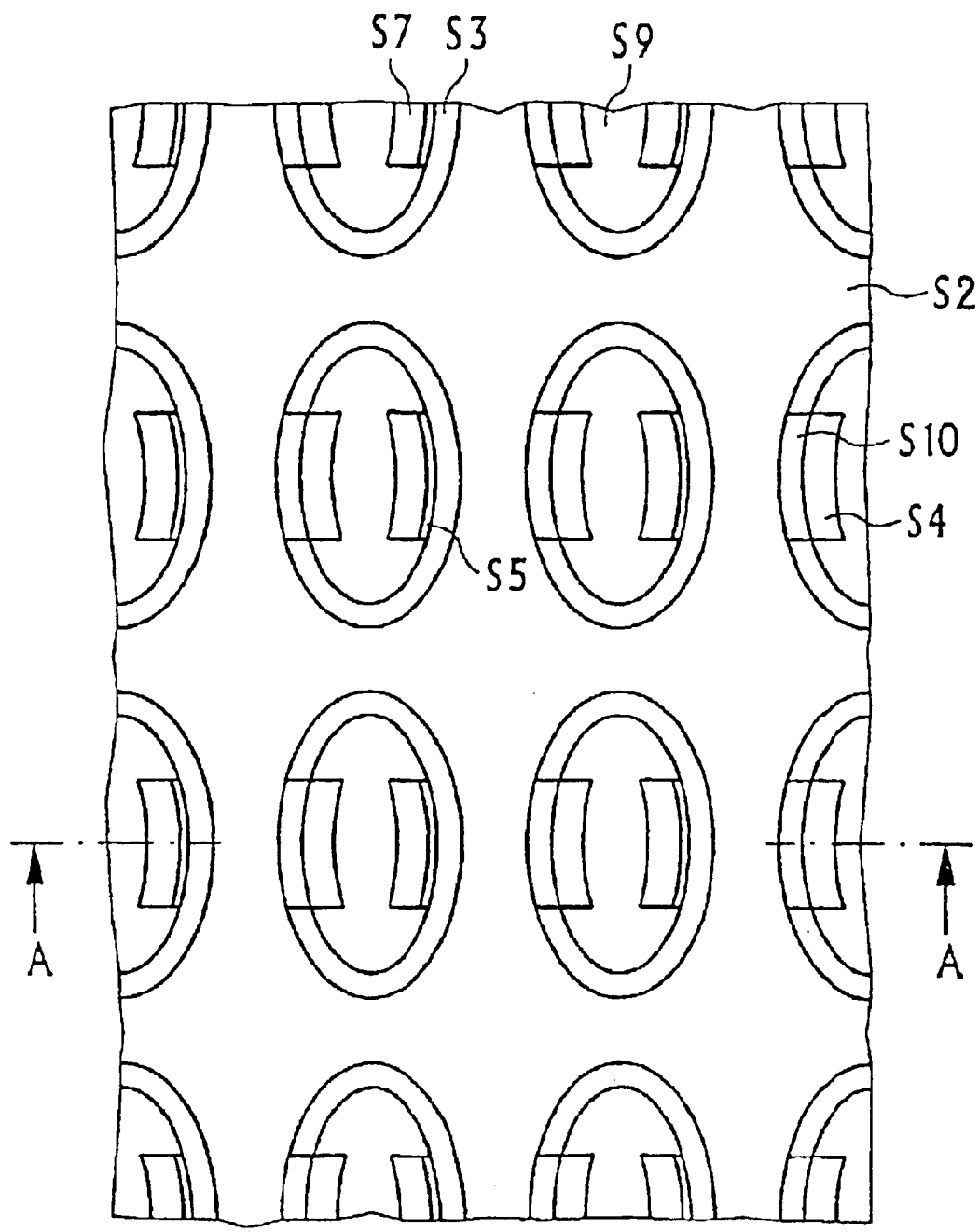
FIG. 4B is a fragmentary, plan view of the configuration of FIG. 4A.
Figure 5A:
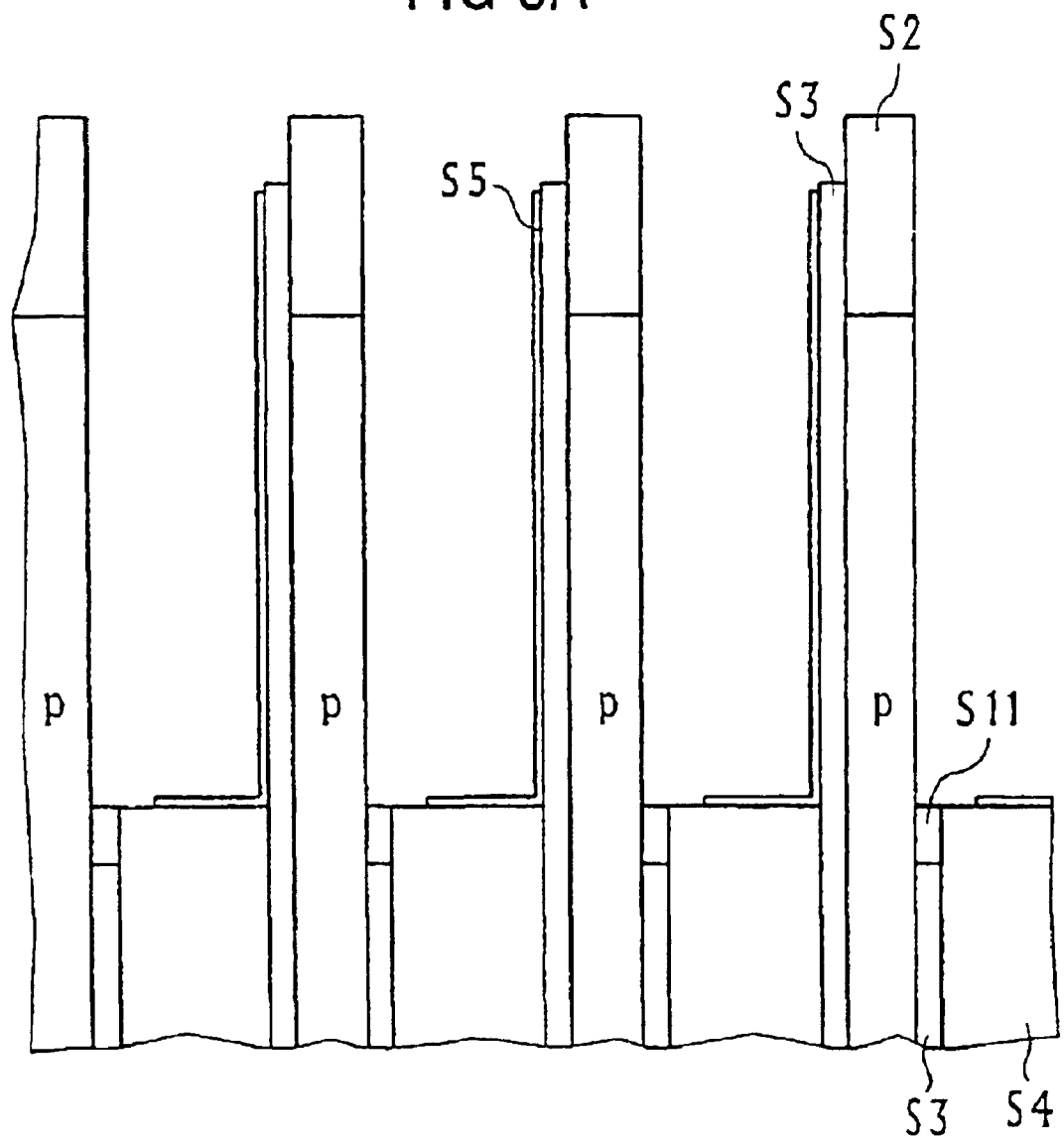
FIG. 5A, is a fragmentary, cross-sectional view of the configuration of FIG. 4A in a subsequent process step according to the invention along section line A—A in FIG. 5B.
Figure 5B:
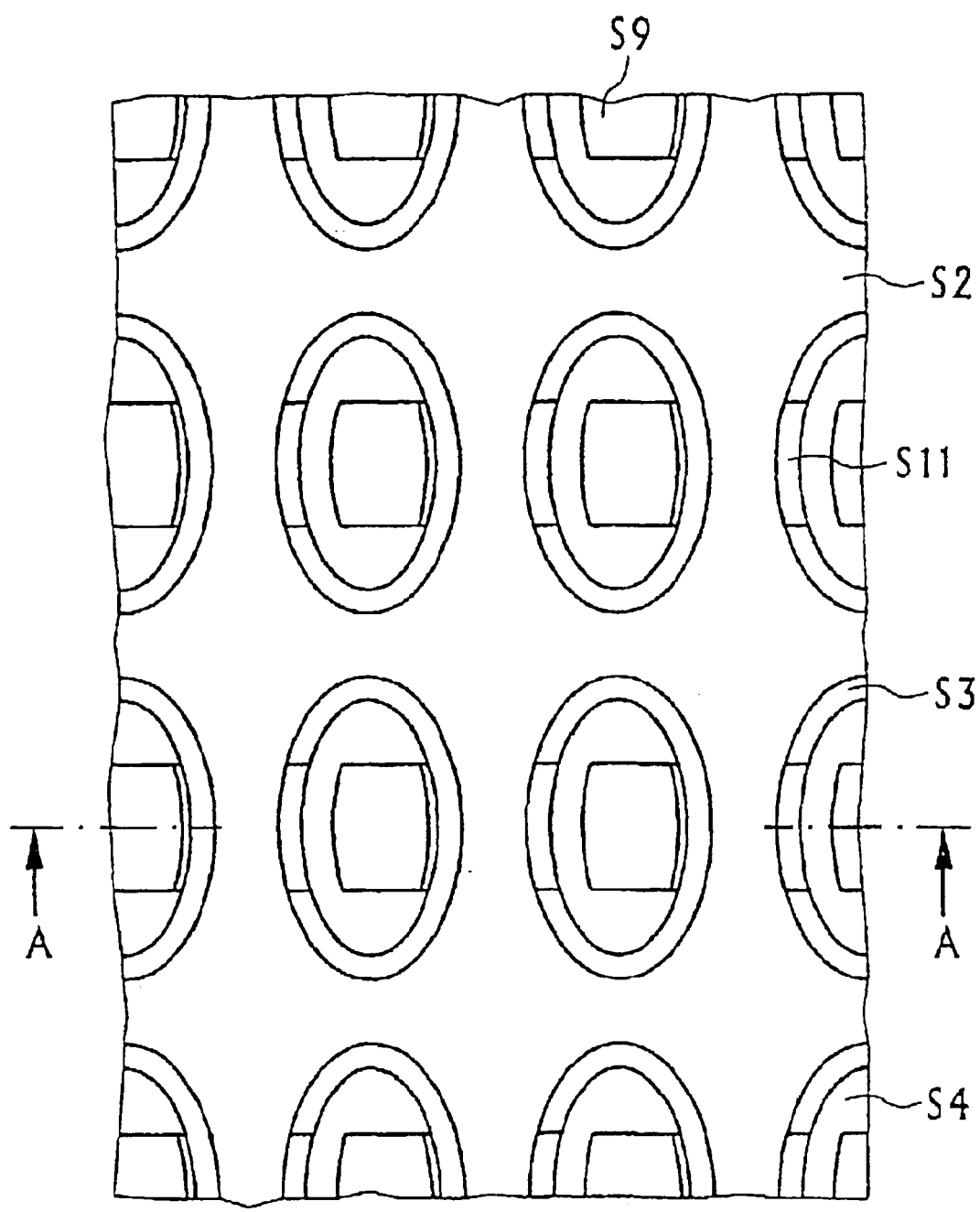
FIG. 5B is a fragmentary, plan view of the configuration of FIG. 5A.
Figure 6A:
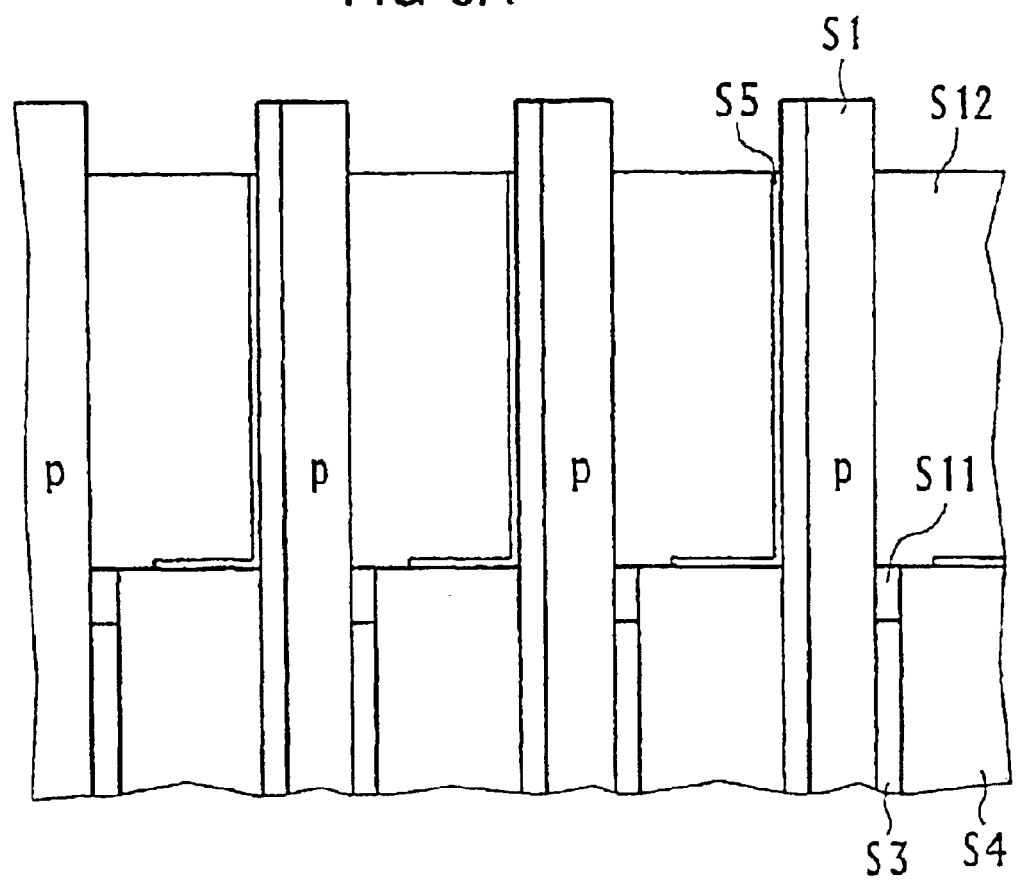
FIG. 6A, is a fragmentary, cross-sectional view of the configuration of FIG. 5A in a subsequent process step according to the invention along section line A—A in FIG. 6B.
Figure 6B:
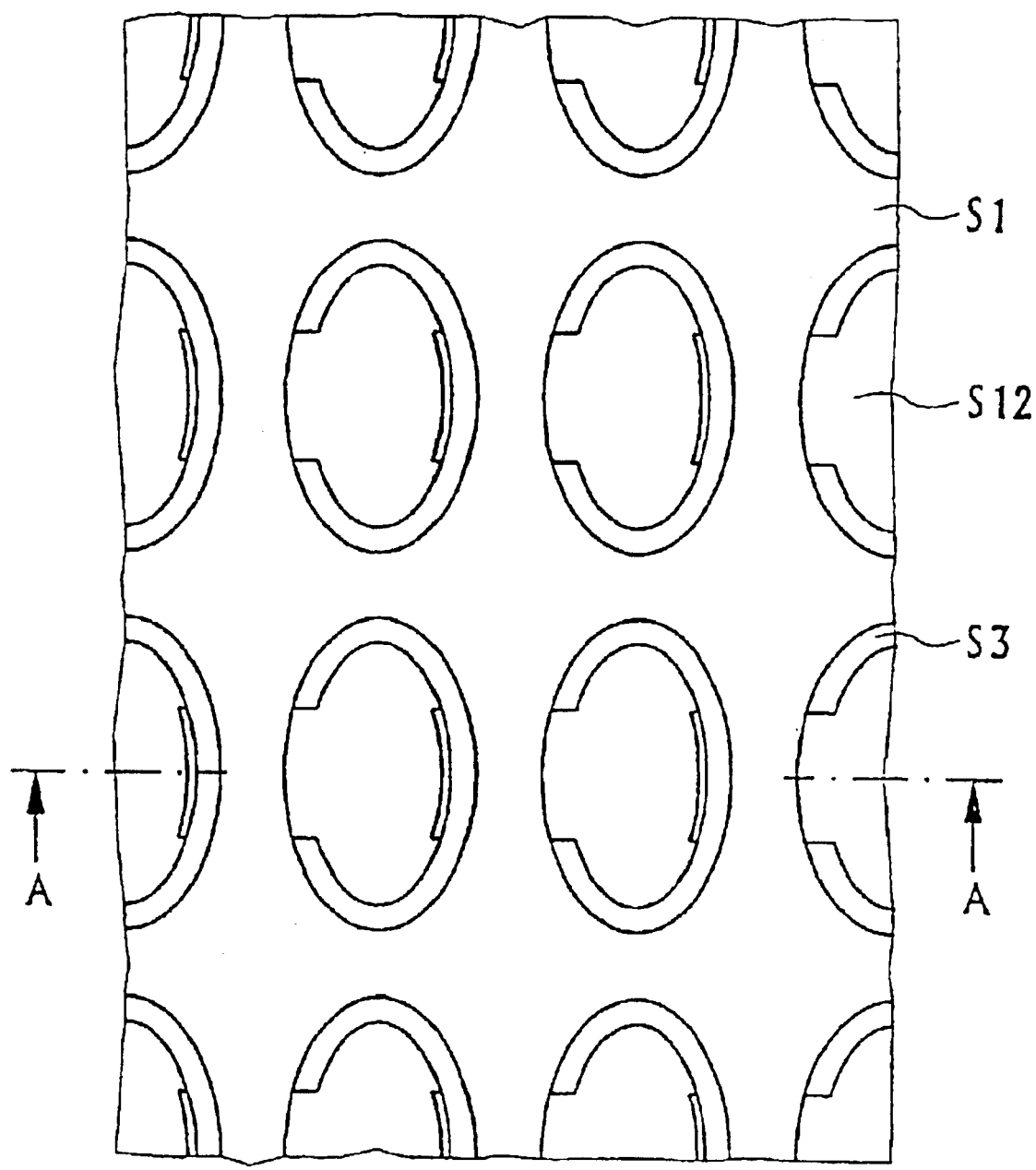
FIG. 6B is a fragmentary, plan view of the configuration of FIG. 6A.

After the removal of the oxide mask, a thermal activation of the dopants in the amorphous silicon spacer S7 on one trench side is carried out, the amorphous silicon spacers S6, S7 being recrystallized. The undoped silicon spacer S6 is, then, removed with the aid of a further photolithography step. For such a purpose, a polymer photoresist S9, preferably, PMMA, with a thickness of approximately 500 nm is firstly spun on. This polymer layer is, then, etched back completely outside the trenches, for example, with $O_2$. Subsequently, the undoped silicon spacer is removed selectively relative to the doped silicon spacer, which is either strongly p- or n-doped. The ONO layer is, then, etched back isotropically by approximately 40 nm with HF. After this process step, a plan view of the silicon wafer as shown in FIG. 4B results. FIG. 4A shows a cross-section along the line A—A of FIG. 4B.

It can clearly be seen that a cutout S10 in the upper edge of the inner polysilicon layer S4 of the trench capacitor is exposed. The connection of the inner electrode of the trench capacitor to the associated selection transistor is, then, produced in this region. The illustrated process cycle for constructing this contact pad with the aid of spacers permits self-adjusting patterning of this contact pad, and, thus, the possibility of producing extremely small cell patterns. The technique of one-sided doping of the silicon spacer is particularly decisive in this case, selected etching processes of the spacer pattern thereby being possible. Exact self-adjusting fixing of the contact pad between the trench capacitor and the associated selection capacitor is thereby achieved.

After the isotropic backetching of the ONO layer S3, which serves to fix the contact pad with the inner electrode of the trench capacitor, this contact pad is, then, filled up. The first step is the complete removal of the PMMA layer S9, for example with $O_2$. Subsequently, the remaining doped polysilicon spacer S7 is etched away, and undoped amorphous silicon S11 with a layer thickness of approximately 15 nm is deposited on the semiconductor pattern. The amorphous silicon S7 is, subsequently, etched back isotropically with $C_2F_6$ and $O_2$ such that the amorphous silicon is, again, removed completely other than at the contact pad in the trench. The silicon wafer after this process step is shown in plan view in FIG. 5B and in cross-section along the line A—A in FIG. 5A.

After the contact pad is filled up, there is then performed in preparation for the patterning of the selection transistor in the pillar next to the trench a process cycle in which, preferably after the TEOS method, oxide S12 with a thickness of approximately 80 nm is firstly deposited. This $SiO_2$ layer is, then, etched back by approximately 130 nm with $CHF_6$ and $O_2$ such that the pillars between the trenches in the region of the upper $Si_3N_4$ layer are exposed. This $Si_3N_4$ layer is, then, removed completely, for example, with $H_3PO_4$. Subsequently, the $SiO_2$ layer is etched back once more by 10 nm with $O_2$. The silicon wafer after this process step is shown in plan view in FIG. 6B and in the cross-section along the line A—A in FIG. 6A.

Subsequently, the vertical selection transistors are constructed laterally relative to the memory capacitors disposed in the trenches. To define the n-channel transistor regions, high n-doping, preferably, by arsenic doping, is introduced in the cell field in a first step by ion implantation and stretches after the outdiffusion to a depth of approximately 100 nm with a doping of $5 \times 10^{19}/cm^3$. This upper n-doped layer S13 fixes the first electrode of the transistor. To construct the second electrode, preferably, likewise by ion implantation with arsenic, there is constructed in the cell field a buried layer S14 in the case of which the depth of the maximum is, preferably, in the region of approximately 400 nm, a vertical layer thickness of approximately 200 nm being produced after the outdiffusion. A doping of approximately $5 \times 10^{18}/cm^3$ is selected for this n-layer. A doping of the contact pad S11 between the second electrode and the inner electrode of the trench capacitor is also carried out simultaneously by the last outdiffusion step.

Figure 7B:
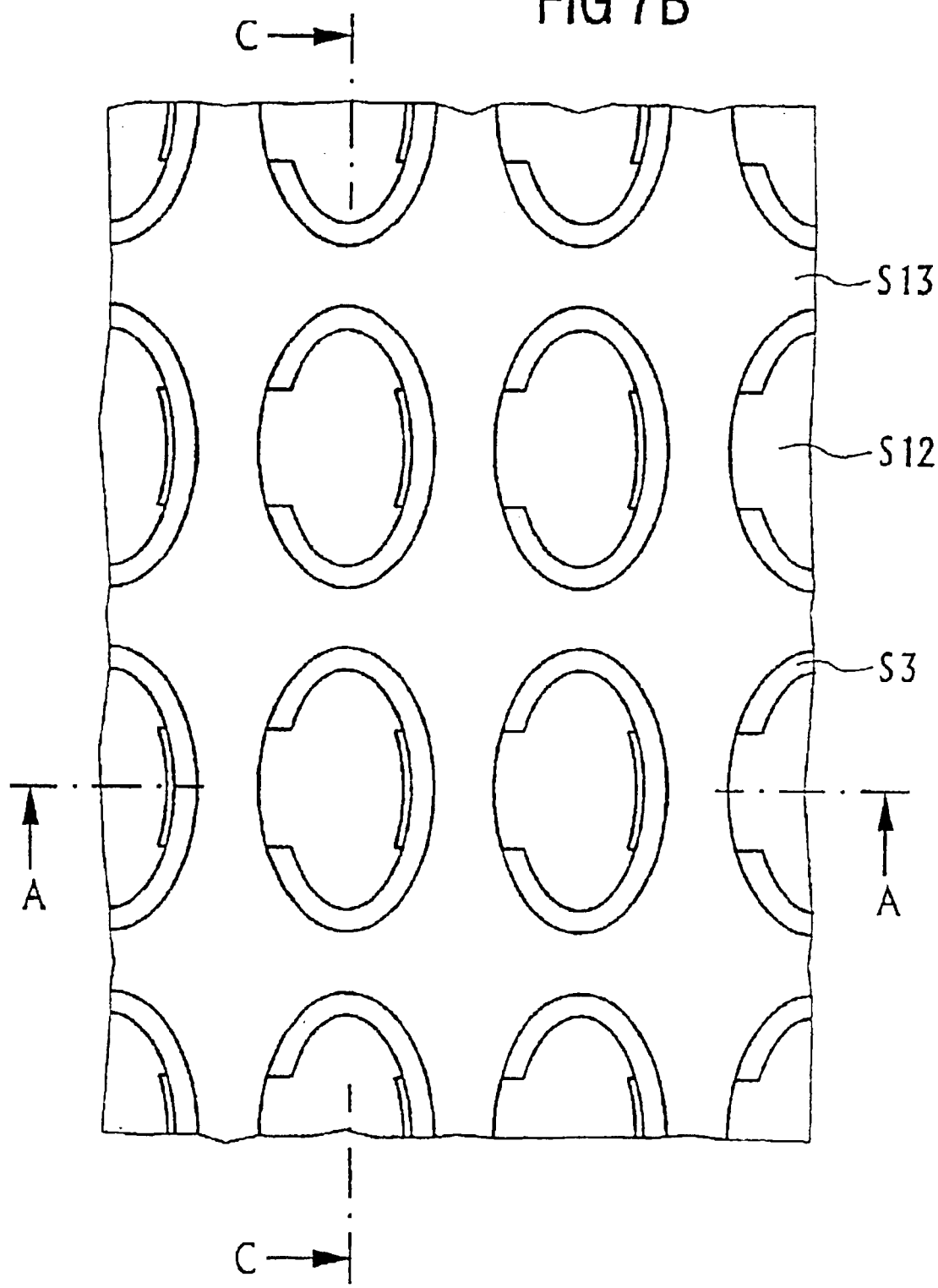
FIG. 7B is a fragmentary, plan view of the configuration of FIG. 7A.
Figure 7C:
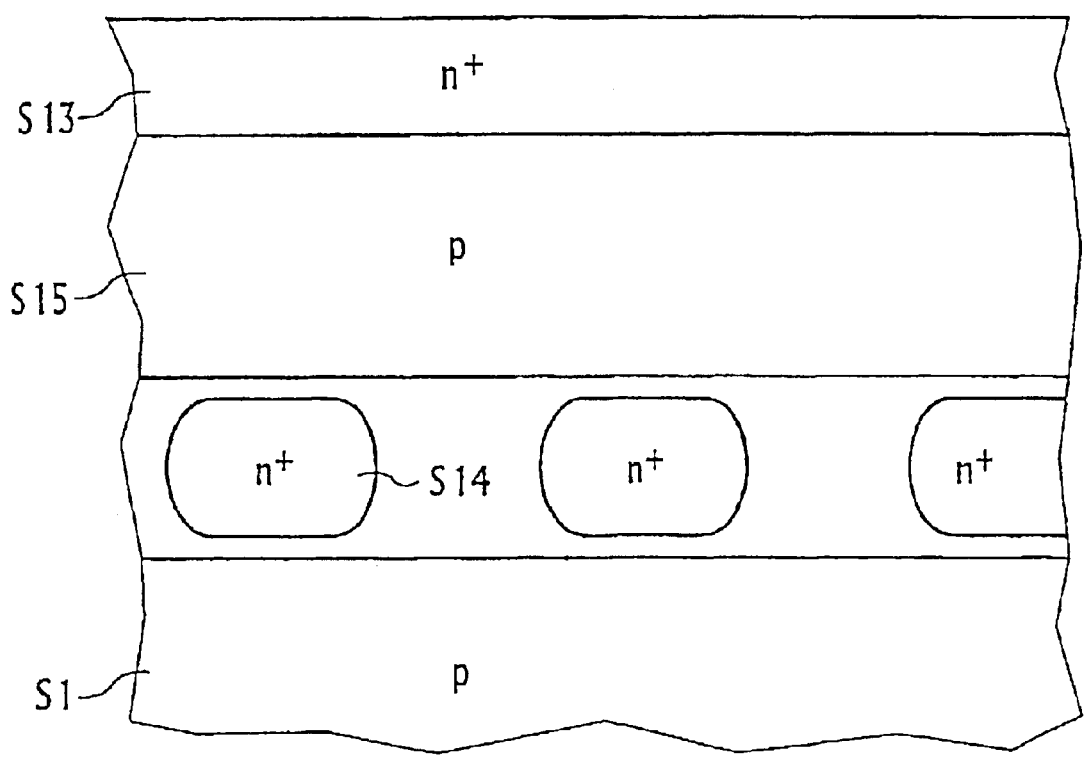
FIG. 7C is a fragmentary, cross-sectional view of the configuration of FIG. 7A along section line C—C in FIG. 7B.
Figure 8B:
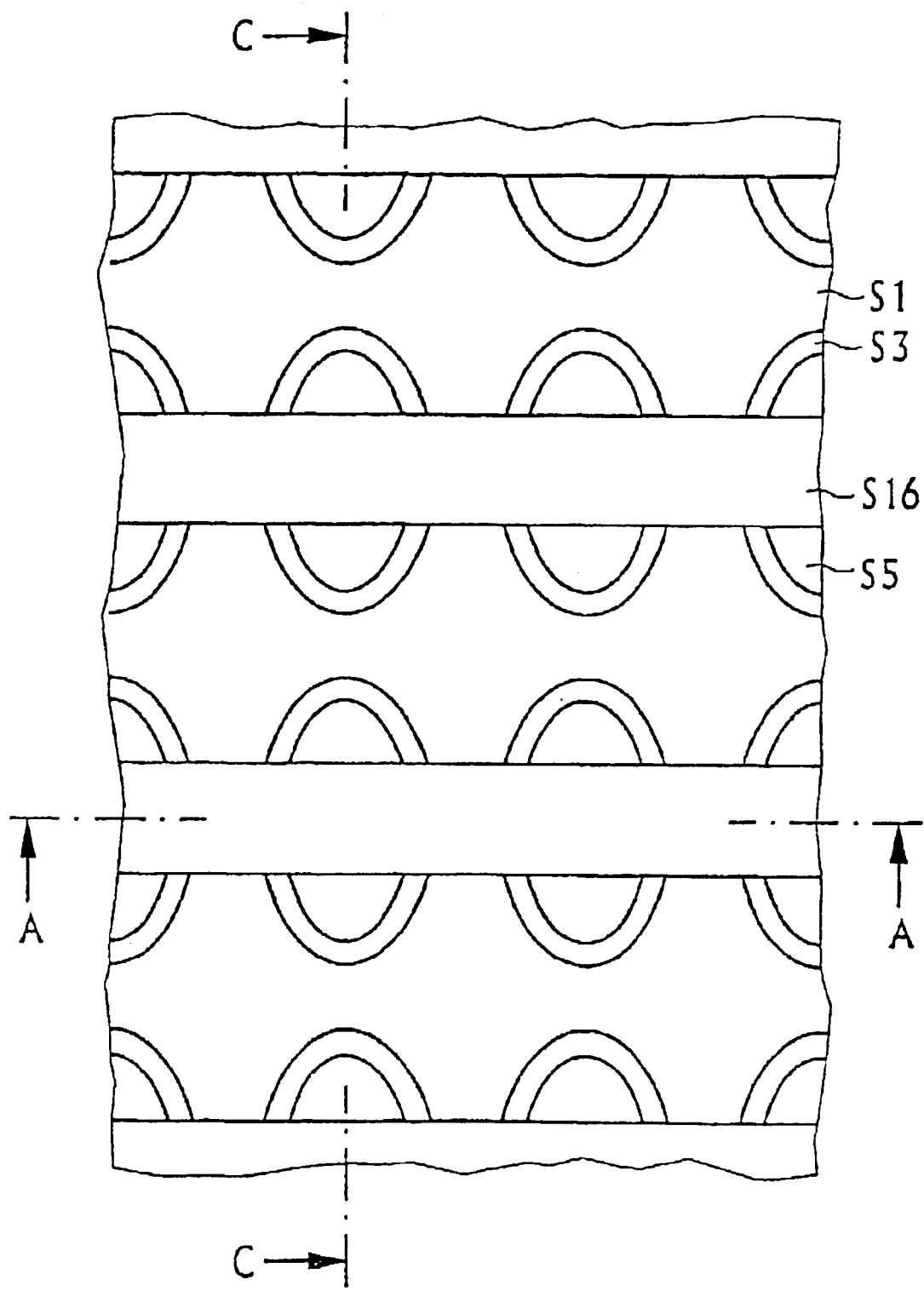
FIG. 8B is a fragmentary, plan view of the configuration of FIG. 8A.
Figure 8C:
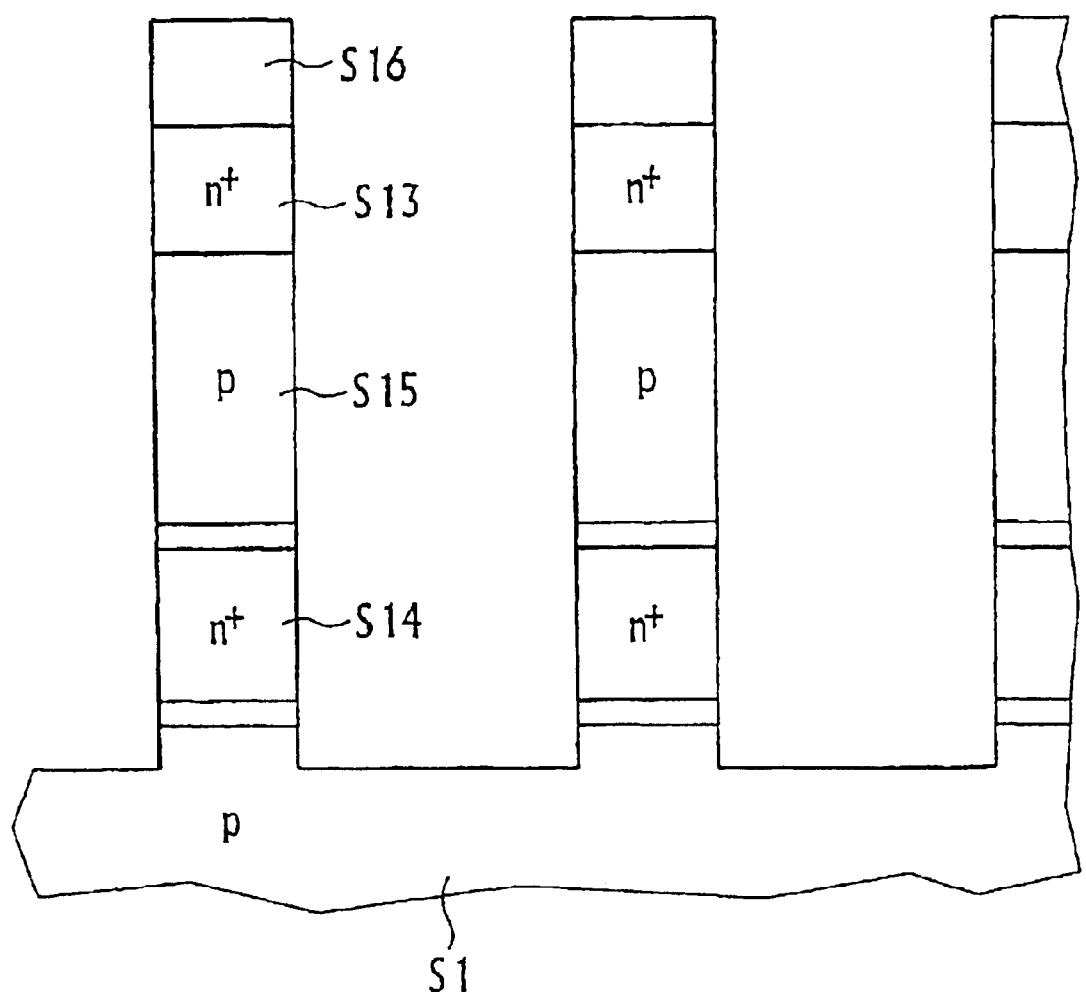
FIG. 8C is a fragmentary, cross-sectional view of the configuration of FIG. 8A along section line C—C in FIG. 8B.

After the production of the first electrode and the second electrode, the channel region is defined by a well implantation. For such a purpose, ion implantation is carried out, preferably, with boron, for the purpose of p-doping, a doping of $1 \times 10^{16}/cm^3$ at a depth of approximately 1 $\mu$m being produced, for example. The well S15 is, then, produced by outdiffusion, it also being possible to perform the outdiffusion step together with the subsequent gate oxidation step. The starting voltage of the n-channel transistor, which is configured to be self-locking, is fixed by setting the doping in the p-well S1. FIG. 7B shows a plan view of the silicon wafer after the definition of the selection transistor. FIG. 7A illustrates a cross-section along the line A—A of FIG. 7B, and FIG. 7C illustrates a cross-section along the line CC of FIG. 7B. The production of the second electrode by ion implantation and outdiffusion permits a self-adjusting joining of the inner electrode of the trench capacitor because the contact pad is also automatically doped by the outdiffusion.

After the definition of the first and second electrode regions, and of the channel area of the selection transistors, these selection transistors are isolated in the vertical, that is to say, y-direction with the aid of trench isolation (STI) technology. For such a purpose, the first step in a process cycle is to use the photolithography technique to pattern an $Si_3N_4$ layer S16 that is deposited with a thickness of approximately 100 nm. The nitride layer S16 is selectively etched in this case with $C_2F_6$ and $O_2$, for example, such that strips of the nitride layer remain in the x-direction over the trench capacitors and fix the region of the selection capacitors respectively belonging to the trench capacitors.

After the removal of the resist mask, the silicon layer exposed between the trench capacitors is, then, etched to a depth of approximately 600 nm, for example, with $C_2F_6$ and $O_2$. After conclusion of this process step, the silicon wafer is shown in plan view in FIG. 8B, in cross-section along the line A—A in FIG. 8A, and in cross-section along the line C—C in FIG. 8C. A simple patterning and isolation of the selection transistors is achieved in the y-direction by the selected trench isolation technique, and, so, the isolation is possible with the aid of a low process outlay.

Figure 9A:
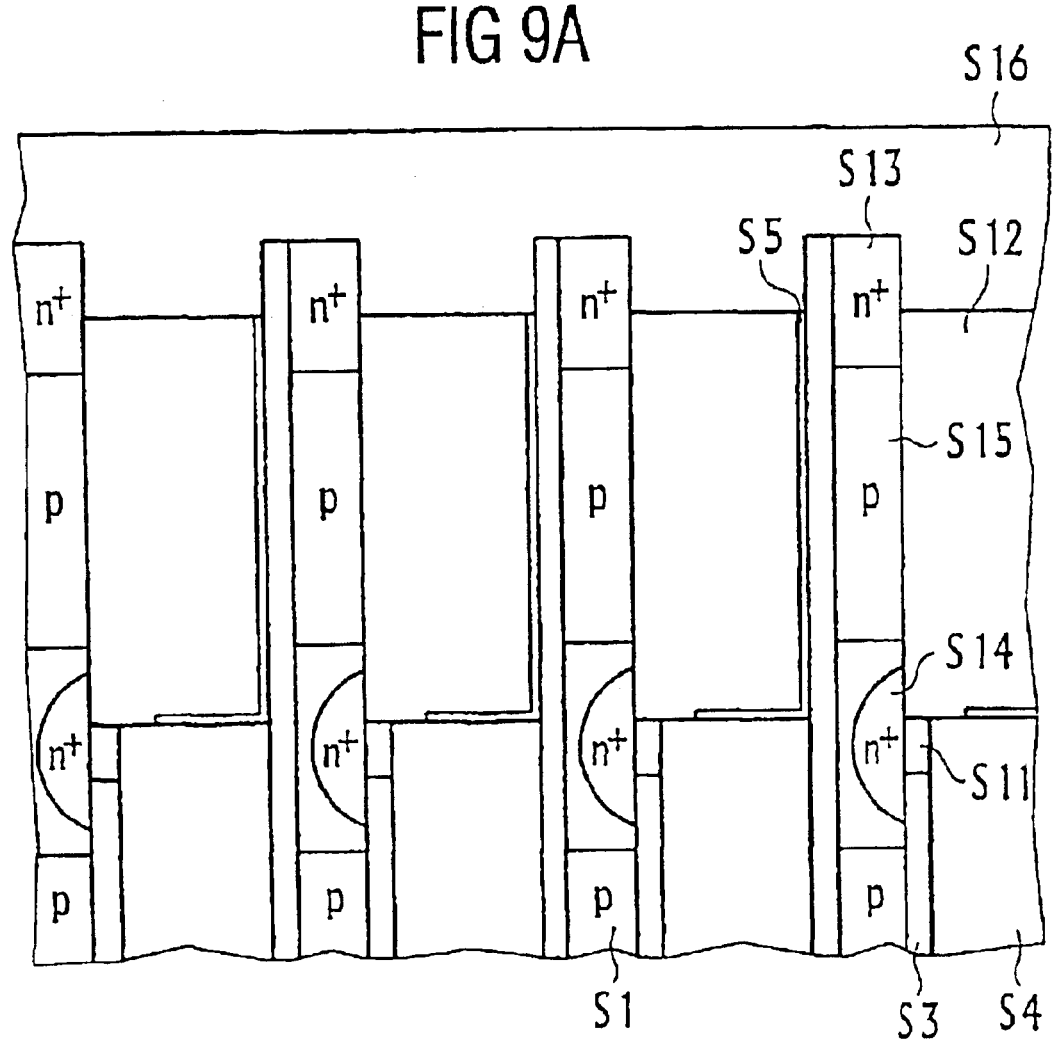
FIG. 9A, is a fragmentary, cross-sectional view of the configuration of FIG. 8A in a subsequent process step according to the invention along section line A—A in FIG. 9B.
Figure 9B:
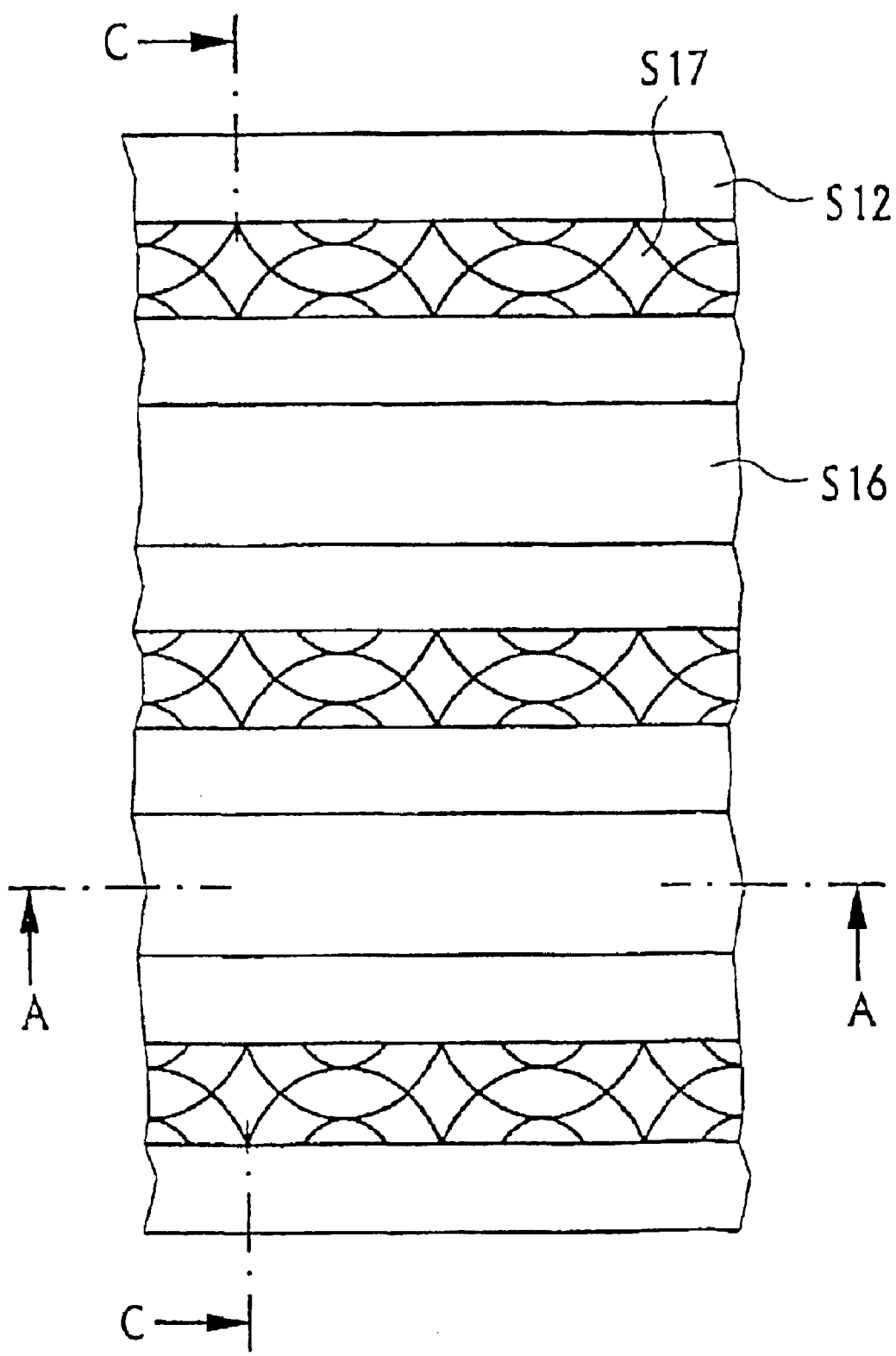
FIG. 9B is a fragmentary, plan view of the configuration of FIG. 9A.

In a further process cycle, a spacer structure is subsequently produced between the selection transistors in the vertical direction, in order to produce a semiconductor memory cell configuration with a staggered bit line pattern, as illustrated in the embodiment in FIG. 12. The first step for such a purpose is to use the TEOS method to deposit an $SiO_2$ layer with a thickness of approximately 50 nm. Subsequently, spacer etching of the oxide layer S12 is performed with $C_2F_6$ and $O_2$, overetching of approximately 80 nm being executed. Selectively undoped polysilicon with a thickness of approximately 550 nm is, then, grown on in the exposed trenches between the spacers such that a supporting pattern is produced. Optionally, the supporting pattern can also be produced by disconnection and backetching of silicon, $Si_3N_4$, and other suitable materials. After production of the supporting pattern, a plan view of the silicon wafer as shown in FIG. 9B results. FIG. 9A shows a cross-section along the line A—A, and FIG. 9C a cross-section along the line C—C.

If, instead of a staggered bit line interconnection as shown in FIG. 12, the aim is to use an open bit line interconnection as shown in the embodiment according to FIG. 13, there is no need for a supporting pattern, and, so, it is possible to eliminate the process cycle that leads from the process image of FIG. 8 to the process image of FIG. 9.

The production of the supporting pattern is followed by the production of a top oxide on the memory capacitors for the purpose of insulating them. An $Si_3N_4$ layer is completely removed for such a purpose in a first step with $H_3PO_4$. Thereafter, the remaining $SiO_2$ layer is etched back to a depth of approximately 380 nm with $CHF_3$ and $O_2$, the etching process not being selective in relation to $Si_3N_4$. The result of this is that the pillars with the transistor patterns and the supporting structures are completely exposed. Subsequently, a trench top oxide S18 with a thickness of preferably 40 nm is produced for the purpose of insulating the memory capacitors. The silicon wafer after this process step is shown in plan view in FIG. 10B, in cross-section along the line A—A in FIG. 10A, and in cross-section along the line C—C in FIG. 10C.

After the production of the trench top oxide S18, the gate pattern for the selection transistors are produced, as are the word lines, in a further process sequence. A gate dielectric S19, preferably, as a thermal oxide with a thickness of approximately 4 nm, is grown on for such a purpose in a first process step. An approximately 20 nm thick polysilicon layer S20 that is highly n-doped is, subsequently, deposited. This polysilicon layer S20 serves as gate electrode for the selection transistors. The word lines connecting the individual gate electrodes are, then, produced. The first step for this purpose is to produce an approximately 2 nm thick non-illustrated depletion layer of tungsten nitride on which tungsten is, then, deposited with a layer thickness S21 of approximately 20 nm.

For the gate electrodes of the selection transistors and the associated word lines to be patterned, the polysilicon layer S20, the depletion layer, and the tungsten layer S21 are, then, etched off anisotropically by approximately 50 nm, preferably, by $C_2F_6$ and $O_2$, so as to form spacers from the gate electrode pattern and the word line pattern around the pillars with the selection transistors, the active regions between the upper and lower electrodes in the pillars being completely embraced by the selection transistors. After this spacer patterning of the gate electrodes and of the word lines, a thin approximately 20 nm thick $Si_3N_4$ layer S22 is deposited in a further process step, and an approximately 200 nm thick $SiO_2$ layer S23 is, then, produced on it, preferably, with the aid of the TEOS method. The oxide layer S23 is, then, ground flat up to the top edge of the nitride layer S22, preferably, with the aid of chemico-mechanical polishing. The nitride is selectively etched off subsequently with $C_2F_6$ and $O_2$. After backetching of the oxide, preferably, with HF, by approximately 40 nm, a pattern results in the silicon wafer as shown in the plan view of FIG. 11B, in cross-section along the line A—A in FIG. 11A, and in cross-section along the line C—C in FIG. 1C.

Figure 11C:
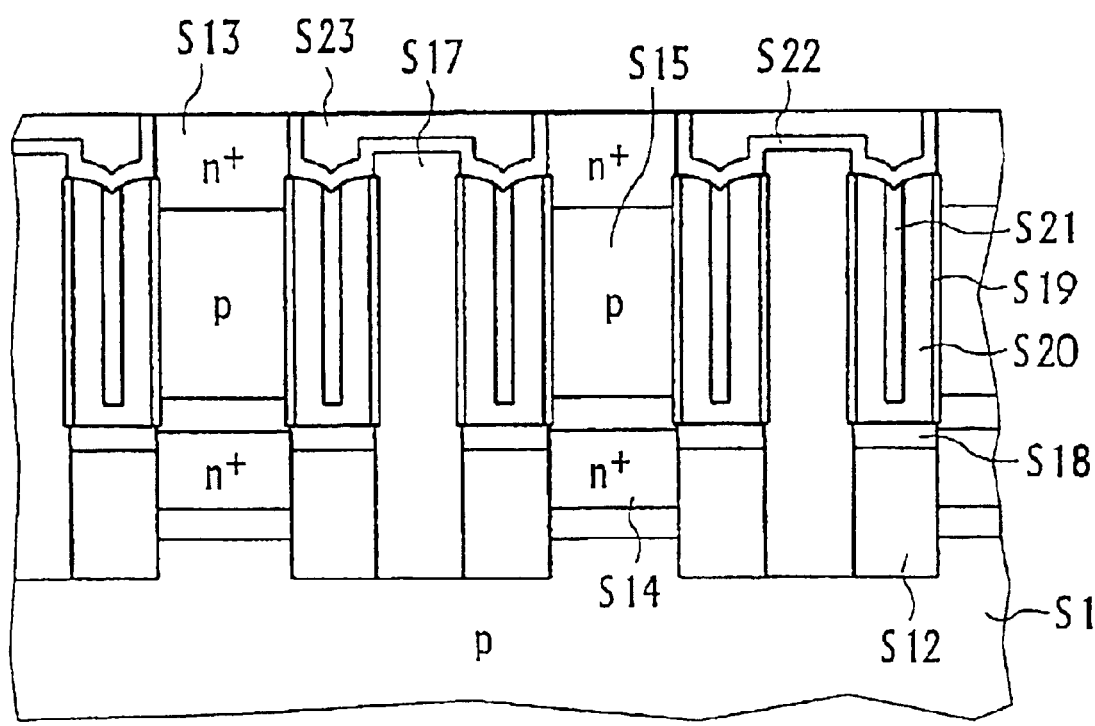
FIG. 11C is a fragmentary, cross-sectional view of the configuration of FIG. 11A along section line C—C in FIG. 11B.

Starting from the process pattern shown in FIGS. 11A to 11C, the polysilicon contacts for the upper electrodes of the selection transistors, and the tungsten metallization for constructing the bit lines are, then, produced such that a DRAM memory cell configuration results as shown in FIGS. 12A to 12C. If, as an alternative, the process sequence for constructing a supporting pattern is dispensed with, the result is a DRAM memory cell configuration as shown in FIGS. 13A to 13C.

Due to the process cycle according to the invention, it is possible to produce a DRAM memory cell configuration, with the trench capacitors and vertical selection transistors, in the case of which the active zone of the selection transistors is completely surrounded by the gate and word line pattern, and that is distinguished by a minimum space requirement. The maximum packing density of the DRAM cells is achieved, in particular, by the use of a self-adjusting memory patterning for the word lines, as explained above.

As an alternative to the embodiments shown, it is within the scope of the invention to use anisotropic and/or crystal-oriented processes for expanding the trench capacitors, in particular, in order, in addition to the trench shapes shown in FIG. 1B, FIG. 14, and FIG. 15, also to achieve further cross-sections for the memory capacitors with the aid of which the memory capacity of these capacitors can, likewise, be expanded.

It is also within the scope of the invention beyond the exemplary embodiments illustrated above to modify the specified dimensions, concentrations, materials, and processes in a suitable way to produce the DRAM memory cell configuration according to the invention. In particular, it is possible in this case to have recourse to known process sequences for constructing the selection transistors, chiefly of the source/drain zones. Furthermore, there is the possibility of complementary design of the conductivity type of the doped zones in the semiconductor pattern. Moreover, the specified dielectrics can also be replaced by other known dielectrics. Instead of silicon oxide, it is possible, for example, to use silicon nitride, aluminum oxide, zirconium oxide, oxide-nitride mixtures, and low k materials. Instead of the ONO intermediate layer in the memory capacitors, it is also possible to use other known dielectrics with a high dielectric constant such as, for example, aluminum oxide, zirconium oxide, tantalum oxide, hafnium oxide, perovskite, in particular, BST. Instead of using tungsten to construct the spacer patterns for the word lines, it is also possible, for example, to use silicides such as, for example, tungsten silicide or silicides of titanium and cobalt, or doped polysilicon. Furthermore, in addition to the illustrated layers, further layer sequences can be introduced into the semiconductor pattern; in particular, to construct barriers to avoid instances of undesired diffusion. In the final analysis, selectivities and mask sequences can be modified in a suitable way in the illustrated patterning processes, without departing from the range of the invention.

The features of the invention that are disclosed in the foregoing description, the drawings and the claims can be significant both alone and in any desired combination for the implementation of the invention in its various refinements.

With reference to FIG. 13A, the vertical selection transistor 2 of the DRAM memory cell includes an upper electrode 21 that is $n^+$-doped, an active intermediate layer 22 that is weakly p-doped, and a lower electrode 23 that is likewise $n^+$-doped. Additionally introduced into the lower electrode 23 is an outdiffusion D whose dopant is outdiffused from the inner electrode 11 of the trench capacitor 1 through the conducting connection 4 into the lower electrode 23.

The vertical selection transistor 2 is constructed in a rib that has the width B. The width B is selected to be so small that the active intermediate layer 22, in which the channel of the transistor 2 is disposed, can be fully depleted. This is achieved, for example, by virtue of the fact that adjacent intermediate layers in adjacent ribs are disposed in a 2F raster. Here, F denotes the smallest periodic, lithographically image structure on the substrate. The width B of the ribs is configured to be substantially smaller than the interspaces between the ribs, such that the interspaces between the ribs in which the trench capacitors are disposed have a width of between 1F and 2F, and the ribs have the width B that results from 2F minus the width B of the trenches. The ribs, therefore, have a width B that is sublithographic.

The plan view of a memory cell field according to the invention is illustrated in FIG. 13B. The rib in which the selection transistor is formed has the width B and a length L. The length L runs in the direction of the word lines, and the width B in the direction of the bit lines. In this case, the length L is formed to be larger than the width B. The invention renders this possible by forming a continuous word line with the aid of a spacer configuration deposited on the rib. The length L is selected such that the spacer depositions on adjacent ribs touch one another and, thus, form the continuous word line. Adjacent word lines are separated from one another along the bit line direction because the rib width B is formed to be smaller than the rib length L, such that adjacent spacer depositions do not touch one another in the direction of the bit line.

The lower electrode 23 extends in the rib along the entire length L and the entire width B such that no additional body contact with the active intermediate layer 22 can be formed. Consequently, no electric contact is made with the active intermediate layer 22 next to the upper electrode 21 and the lower electrode 23. This is also not necessary because the invention, advantageously, constructs the rib with the width B to be so narrow so that it is completely depleted and, thus, the floating body effects disadvantageously occurring in field effect transistors can be avoided.

The lower electrode 23 is formed, for example, as a buried layer before the trench capacitors and the ribs of the memory configuration are patterned. As a result, the respective lower electrodes of the adjacent selection transistors are separated from one another. For such a purpose, the lower electrode can be formed as an epitaxially grown-on layer that is formed with the aid of an appropriate $n^+$-doping. The active layer 22 is, then, likewise grown epitaxially onto the epitaxially grown-on layer 23. As an alternative, the lower electrode 23 can be produced by implantation, the layer 23 being implanted with suitable implantation parameters as a buried layer.

The position and the thickness of the layer 23 from which the lower electrodes 23 are subsequently formed can be set very accurately with the aid of such a method.

The upper electrode 21 can, subsequently, be formed by implantation both before and after the formation of the trenches for the trench capacitors 1.

The gate electrode and the word line are formed by spacer technology. A layer that is also precipitated around the ribs of the selection transistors is deposited conformly (isotropically) for such a purpose, for example. Directional (anistropic) etching is used to etch back the previously deposited layer such that a gate electrode is formed around the ribs. The individual gate electrodes around the ribs are continuous in the direction of the word line because the spacing of the ribs in the direction of the word lines is so small that a continuous word line is produced.

The active intermediate layer 22 in which a channel of the vertical selection transistor 2 can be constructed is substantially disposed between the trenches 1 of adjacent memory cells. The controllable flow of current in the selection transistors takes place in this case substantially between the trenches.

The trench capacitor 1 and the associated vertical selection transistor 2 of the dynamic memory cell 10 can be disposed substantially below an associated bit line 6.

The minimum spacing between two adjacent word lines can be formed twice as large as the minimum pattern size of the lithography technique with the aid of which the memory cells are produced. The minimum spacing between two adjacent bit lines can, likewise, be formed twice as large as the minimum pattern size of the lithography technique with the aid of which the memory cells are produced, thus rendering possible memory cells that require a substrate surface of $4F^2$.

The supporting pillars according to the invention render possible memory cells that require a substrate surface of $6F^2$. The greater space requirement can be used for the purpose of implementing, for example, a folded bit line concept in the case of which a read amplifier compares an active bit line with a non-active bit line. In such a case, it is possible according to the invention for the word line to be formed in a self-adjusting fashion without a mask both for the 4F² memory cell and for the 6F² memory cell, and this economizes on an additional space requirement for adjustment tolerances.

A region of the inner electrode of the trench capacitors 1 can be exposed in the selective etching of the doped, separated spacers.

The upper electrode 21 of the selection transistor 2 can be defined by a trench isolation process and formed by a subsequent implantation.

We claim:

1. A semiconductor memory cell configuration, comprising:

bit lines;

word lines;

dynamic memory cells disposed in a matrix and having trench capacitors and vertical selection transistors, said trench capacitors being connected to associated ones of said vertical selection transistors in a substantially parallel direction to the bit lines, each of said dynamic memory cells having:

a trench capacitor having:

a block-shaped inner electrode;

a dielectric intermediate layer surrounding said inner electrode; and an outer electrode in contact with said dielectric intermediate layer;

a vertical selection transistor disposed substantially above said trench capacitor and having:

a layer sequence disposed offset from said inner electrode of said trench capacitor, said layer sequence having:

a first electrode connected to a respective one of said bit lines;

an active intermediate layer; and a second electrode connected to said inner electrode of said trench capacitor;

an insulating layer; and a gate electrode layer connected to a respective one of said word lines, said gate electrode layer and said insulating layer completely surrounding said active intermediate layer, said one word line and said one bit line crossing one another; and said trench capacitors and associated ones of said vertical selection transistors of said dynamic memory cells being disposed in rows respectively along said bit lines and in columns respectively along said word lines directly following one another and in each case with a substantially equal spacing from said bit lines.

2. The semiconductor memory cell configuration according to claim 1, wherein:

said trench capacitors have trenches;

said vertical selection transistor has a channel in said active intermediate layer; and said active intermediate layer is disposed substantially between trenches of adjacent trench capacitors.

3. The semiconductor memory cell configuration according to claim 2, wherein said dynamic memory cells are constructed to substantially dispose said vertical selection transistor as a first column and substantially dispose said trench capacitor as a second column.

4. The semiconductor memory cell configuration according to claim 3, including:

a semiconductor substrate having a buried highly doped plate, said trench capacitors being disposed in said semiconductor substrate both equally spaced in an x-direction and equally spaced in a y-direction;

said dielectric intermediate layer lining said trenches;

a substantially block-shaped highly doped semiconductor layer filling up said trenches as an inner electrode;

an insulating layer covering said trenches; and said dielectric intermediate layer being in contact with said buried highly doped plate as an outer electrode.

5. The semiconductor memory cell configuration according to claim 4, wherein said trenches of said trench capacitors have a cross-sectional shape selected from a group consisting of oval, rectangular, and square.

6. The semiconductor memory cell configuration according to claim 4, wherein:

said inner electrode has an upper end;

said vertical selection transistor is a MISFET transistor having, in a region of said upper end, said second electrode as a highly doped layer on which a weakly doped layer is disposed as an active region;

said first electrode is a highly doped layer; and a conductive connection is formed between said second electrode of said MISFET transistor and said inner electrode of said trench capacitor through said dielectric intermediate layer.

7. The semiconductor memory cell configuration according to claim 6, wherein, between said second column of one of said MISFET transistors belonging to said trench capacitor and said second column of another of said MISFET transistors belonging to said trench capacitor following thereupon, there is disposed on said insulating layer covering said inner electrode of said trench capacitor a gate electrode layer sequence extending substantially around an entirety of said active region of said MISFET transistor, said gate electrode layer sequence having a gate dielectric layer, a gate electrode layer, and a conducting layer serving as said word line.

8. The semiconductor memory cell configuration according to claim 7, wherein:

said vertical selection transistor forms a pillar;

a supporting column is spacer-technique constructed between ones of said vertical selection transistors belonging to the same one of said word lines and, in each case, to consecutive ones of said bit lines to form spacer patterns surrounding said supporting column and extending parallel to said pillar; and said gate electrode layer sequence is respectively disposed between said pillar of said vertical selection transistor and said supporting column of said gate electrode layer sequence.

* * * * *